United States Patent
Kanaya et al.

(10) Patent No.: US 6,611,014 B1
(45) Date of Patent: Aug. 26, 2003

(54) SEMICONDUCTOR DEVICE HAVING FERROELECTRIC CAPACITOR AND HYDROGEN BARRIER FILM AND MANUFACTURING METHOD THEREOF

(75) Inventors: Hiroyuki Kanaya, Yokohama (JP); Toyota Morimoto, Sagamihara (JP); Osamu Hidaka, Hachioji (JP); Yoshinori Kumura, Yokohama (JP); Iwao Kunishima, Yokohama (JP); Tsuyoshi Iwamoto, Urayasu (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/570,026

(22) Filed: May 12, 2000

(30) Foreign Application Priority Data

May 14, 1999 (JP) ............................................ 11-135066

(51) Int. Cl.$^7$ ................................................ H01L 29/66
(52) U.S. Cl. ...................................... 257/295; 257/311
(58) Field of Search ................................. 257/295, 301, 257/303, 311, 532, 535; 438/3, 396, 387

(56) References Cited

U.S. PATENT DOCUMENTS

| 5,185,689 A | | 2/1993 | Maniar | |
|---|---|---|---|---|
| 6,242,299 B1 | * | 6/2001 | Hickert | ...................... 438/240 |
| 6,316,801 B1 | * | 11/2001 | Amanuma | .................. 257/306 |

FOREIGN PATENT DOCUMENTS

| JP | 04-102367 | | 4/1992 | |
|---|---|---|---|---|
| JP | 06-013346 | | 1/1994 | |
| JP | 06-209113 | | 7/1994 | |
| JP | 7-111318 | | 4/1995 | |
| JP | 7-273297 | | 10/1995 | |
| JP | 8-335673 | | 12/1996 | |
| JP | 09-331031 | * | 12/1997 | ............ H01I/27/10 |
| JP | 10-012830 | | 1/1998 | |
| JP | 10-116965 | | 5/1998 | |
| JP | 10-255483 | | 9/1998 | |
| JP | 10-275897 | | 10/1998 | |
| JP | 11-017124 | | 1/1999 | |
| WO | WO 009735341 | | 9/1997 | |

OTHER PUBLICATIONS

T. Morimoto et al., "Excellent Ferroelectric Properties in PZT Capacitor Cell with Thin SRO Film in Both Top and Bottom Electrodes", Extended Abstracts of the 1999 International Conference on Solid State Devices and Materials, Tokyo, 1999, pp. 396–397.*

N. Tanabe, T. Matsuki, S. Saitoh, T. Takeuchi, S. Kobayashi, T. Nakajima, Y. Maejima, Y. Hayashi, K. Amanuma, T. Hase, Y. Miyasaka and T. Kunio, A Ferroelectric Capacitor over Bit–line (F–COB) Cell for High Density Nonvolatile Ferroelectric Memories, 1995 Symposium on VLSI Technology Digest of Technical Papers, pp. 123–124, 0–7803–2602–4/95, Microelectronics Research Laboratories, Fundamental Research Laboratories, NEC Corporation 1120, Shimokuzawa, Sagamibara, Kanagawa 229, Japan.

T. Morimoto, et al., "Excellent Ferroelectric Properties in PZT Capacitor Cell with Thin SRO Film in Both Top and Bottom Electrodes", Extended Abstracts of the 1999 International Conferene on Solid State Devices and Materials, Tokyo, 1999, pp. 396–397.

English Language Translation of Japanese Laid–Open Publication No. Hei 9–331031 1997, filed Dec. 22, 1997 (translated by Hidetoshi Kitsuya, Dec. 5, 2002).

* cited by examiner

Primary Examiner—Evan Pert
(74) Attorney, Agent, or Firm—Banner & Witcoff, Ltd.

(57) ABSTRACT

A semiconductor device having a semiconductor substrate; an insulating film formed on said semiconductor substrate; a ferroelectric capacitor having a lower electrode, a ferroelectric film and an upper electrode which are stacked sequentially on the insulating film; a first hydrogen barrier film; a first inter-layer insulating film covering said ferroelectric capacitor; and a second inter-layer insulating film stacked on the first inter-layer insulating film, the first hydrogen barrier film being interposed between the first and second interlayer insulating films is proposed.

31 Claims, 36 Drawing Sheets

SEMICONDUCTOR DEVICE HAVING FERROELECTRIC CAPACITOR AND HYDROGEN BARRIER FILM AND MANUFACTURING METHOD THEREOF

BACKGROUND OF THE INVENTION

This invention relates to a semiconductor device having a ferroelectric capacitor and its manufacturing method.

For years, there are known non-volatile ferroelectric memory devices for non-volatile storage of data by using spontaneous polarization of a ferroelectric capacitor. Ferroelectric random access memory is usable without a battery and operable at a high speed. Its development to non-touch cards (radio frequency identification, herein after abbreviated RF-ID) is going to start, and its use in replacement of existing SRAM (static random access amemory), DRAM (dynamic random access memory), flash memory, etc.) and also as memory integrated with logic circuit, is hopefully expected.

A ferroelectric capacitor is typically made by using platinum (Pt) as upper and lower electrodes and a PZT ($PbZr_{1-x}TiO_x$) film as its ferroelectric film. For fabricating ferroelectric random access memory in an LSI process using a silicon substrate, a surface of the silicon substrate having formed transistors and other elements is covered with an insulating film such as silicon oxide film, and a lower Pt electrode, PZT film and upper Pt electrode are made by patterning, to thereby make the ferroelectric capacitor. Normally, a Ti or $Ti_xO_y$ film, for example, is interposed as a base layer of the lower Pt electrode to improve its adherence.

It is known that, with this conventional ferroelectric capacitor, a reducing gas of hydrogen, etc. generated in a Si-LSI process invites deterioration of the ferroelectric property, that is, degradation of spontaneous polarization. As a countermeasure against characteristic deterioration of the ferroelectric capacitor due to reduction by hydrogen, there have been proposed some protection techniques for preventing entry of hydrogen, etc. into the capacitor portion. Heretofore, however, there have been no simple and reliable techniques.

Ferroelectric capacitors involve various problems such as deterioration of the property caused by process damage, which must be removed, in addition to characteristic deterioration due to reduction by hydrogen.

For example, Japanese Patent Laid-Open Publication No. H 8-335673 discloses a method for covering a ferroelectric capacitor with a diffusion inhibiting film to prevent direct contact of the ferroelectric capacitor of PZT or other material and a $SiO_2$ insulating film and thereby prevent mutual diffusion of elements between them. The publication indicates that $TiO_2$, $ZrO_2$ and $Al_2O_3$, for example, are effective as the diffusion inhibiting film. However, this publication deals with exfoliation of the capacitor ferroelectric film by mutual diffusion, and not the problem of characteristic deterioration of the ferroelectric capacitor by diffusion of hydrogen generated, in the fabricating process.

On the other hand, through recent research, the Inventors have come to realize that the use of the $Ti_xO_y$ film as the adhesion layer between the ferroelectric capacitor and the $SiO_2$ film invites some undesirable problems, including deterioration of the ferroelectric property by diffusion of Ti into the PZT film, for example.

SUMMARY OF THE INVENTION

It is therefore an object of the invention to provide a semiconductor device having a ferroelectric capacitor with an excellent property and is manufacturing method.

A feature of the invention is that, in semiconductor devices having a ferroelectric capacitor whichi comprises a semiconductor substrate, and a ferroelectric capacitor composed of a lower electrode, ferroelectric film and upper electrode sequentially stacked on the semiconductor substrate via an insulating film, at least one of the upper and lower electrodes forming the, ferroelectric capacitor is covered with a hydrogen barrier film which does not contain titanium.

More specifically, the hydrogen barrier film is formed on the surface of at least one of the position between the lower electrode and the insulating film and the. surface of the upper electrode.

In the present invention, thehydrogen barrier film not containing titanium is preferably a metal oxide film having a hydrogen diffusion constant of $10^{-5}$ cm$^2$/s or less. The hydrogen barrier film not containing titanium is required to have a high resistance if it is formed so as not to short-circuit the electrodes above on and under the ferroelectric capacitor. In this case, the metal oxide film preferably has a specific resistance not lower than 1 kΩcm. By making such a hydrogen barrier film on at least one of the base layer of the lower electrode and the upper surface of the upper electrode, deterioration in property of the ferroelectric film due to reduction by hydrogen is prevented. Additionally, by selecting an appropriate material for the hydrogen barrier film, it functions as an adhesion layer and exfoliation of the capacitor formed on the insulating film is prevented.

In this specification, the "hydrogen barrier film" pertains to a barrier film against diffusion of a reducing gas like fluorine other than hydrogen gas, and it is used because of its function to prevent damage to the ferroelectric film in the fabrication process. Still in this specification, the "ferroelectric capacitor" pertains to a capacitor not only of a type formed independently from a transistor like in ferroelectric random access memory of a one-transistor/one-capacitor type memory cell structure but also of a type formed in the gate portion of a transistor integrally therewith like in a memory cell of a one-transistor type ferroelectric random access memory.

Still in this specification, the "metal oxide" pertains to a oxide not only of a type including a single metal element but also of a type including more than two metal elements.

In the present invention, when the hydrogen barrier film is interposed under the lower electrode, it is made simultaneously with the lower electrode by patterning. In a structure where the ferroelectric film of the ferroelectric capacitor and the lower electrode are formed to lie over a larger area than that of the upper electrode, the hydrogen barrier film is made to extend from the upper surface of the upper electrode to its side surface and then onto the upper surface of the ferroelectric film. Alternatively, if the lower electrode of the ferroelectric capacitor is made to lie over a larger area than those of the upper electrode and the ferroelectric film, the hydrogen barrier film is made to extend from the upper surface of the upper electrode, covering its side surface and further the side surface of the ferroelectric film, onto the upper surface of the lower electrode.

In the present invention, the ferroelectric capacitor may be configured so that at least a part thereof from the lower electrode to the ferroelectric film is buried in a groove formed in the insulating film. In this case, the hydrogen barrier film is buried in the groove so as to cover the bottom and side surfaces of the ferroelectric capacitor. The hydrogen barrier film may be brought into direct contact with the ferroelectric capacitor, or may be buried not to contact directly. In this case, the hydrogen barrier film is preferably formed also on the upper surface of the ferroelectric capacitor.

The present invention is also characterized in that, in a semiconductor device which comprises a semiconductor substrate, a ferroelectric capacitor having a lower electrode, ferroelectric film and upper electrode sequentially stacked on the semiconductor substrate via an insulating film, and an inter-layer insulating film formed to cover the ferroelectric capacitor, the inter-layer insulating film has a multi-layered structure including first and second inter-layer insulating films, and a hydrogen barrier film is buried between the first and second inter-layer insulating films.

That is, the hydrogen barrier film need not be in direct contact with the ferroelectric capacitor. Also when the hydrogen barrier film is buried inside the inter-layer insulating film covering the ferroelectric capacitor, it is possible to prevent diffusion of hydrogen into the ferroelectric capacitor and prevent deterioration of the ferroelectric property. In this case, thickness of the portion between the hydrogen barrier film and the ferroelectric capacitor is preferably in the range from 0.05 times to three times of the thickness of the ferroelectric capacitor, and this portion functions to prevent reaction which will occur if the hydrogen barrier film and the ferroelectric capacitor contact directly.

Furthermore, in the present invention, if the hydrogen barrier film is interposed between the lower electrode and the underlying insulating film, the hydrogen film is processed by dry etching in self alignment with the ferroelectric film and the lower electrode. In this case, when the etching surface becomes near a vertical surface, etched substance of the hydrogen barrier film again stacks on the side surfaces of the ferroelectric film and the lower electrode already processed, and this forms an effective hydrogen barrier film on side surfaces of the capacitor.

It is preferable that the hydrogen barrier film has a large specific resistance as referred to above. From this viewpoint, the following materials are used, depending on its location.

As the hydrogen barrier film interposed between the lower electrode of the ferroelectric capacitor and the insulating film, one having a small resistance is acceptable,: and it is made of at least one kind of material selected from metal oxides such as $Al_2O_3$, $Al_xO_y$, $Al_xSi_yO_z$, AlN, WN, $SrRuO_y$, $Ir_xO_y$, $Zr_xO_y$, $Ru_xO_y$, $Sr_xO_y$, $Re_xO_y$, $Os_xO_y$, and $Mg_xO_y$. For the hydrogen barrier film, these metal oxides can be usable in either an amorphous state, a microcrystalline state, a polycrystalline state or a crystalline state. The same applies to the hydrogen barrier layer formed on the surface of the upper electrode of the ferroelectric capacitor.

The hydrogen barrier film which extends from the upper surface of the upper electrode of the ferroelectric capacitor, through its side surface and the side surface to the ferroelectric film, onto the upper surface of the lower electrode, is required to have a high resistance, more specifically, a specific resistance not lower than 1 kΩcm, and at least one material is selected for it from metal oxides such as $Al_2O_3$, $Al_xO_y$, $Al_xSi_yO_z$, $Zr_xO_y$ and $Mg_xO_y$.

The hydrogen barrier film buried in the inter-layer insulating film is made of at least one of materials selected from metal oxides such as $Al_2O_3$, $Al_xO_y$, $Al_xSi_yO_z$, $Ti_xO_y$, $Zr_xO_y$, $Mg_xO_y$ and $Mg_xTi_yO_z$.

The present invention is also characterized in that, in a semiconductor device which comprises a semiconductor substrate, and a ferroelectric capacitor having a lower electrode, ferroelectric film and upper electrode sequentially stacked on the semiconductor substrate via an insulating film, a first $Sr_xRu_yO_z$ film is interposed between the ferroelectric film and the lower electrode, a second $Sr_xRu_yO_z$ film is interposed between the ferroelectric film and the upper electrode, and these first and second $Sr_xRu_yO_z$ films have thicknesses $T_{sro}(BE)$ (nm) and $T_{sro}(TE)$ (nm) in the range satisfying $10 \leq T_{sro}(BE)+T_{sro}(TE) \leq (2/12)T_{pzt}$ with respect to the thickness $T_{pzt}$ of the ferroelectric film.

By inserting $Sr_xRu_yO_z$ films on the upper and lower boundaries of the ferroelectric film while controlling their sum thickness to be in a certain range relative to the thickness of the ferroelectric film, the fatigue characteristic of the ferroelectric capacitor is improved significantly. Particularly, it has been experimentally confirmed that their sum thickness in the range of $T_{sro} \leq (2/15)T_{pzt}$ is more preferable.

The present invention is also characterized in that, in a semiconductor device which comprises a semiconductor substrate having formed a transistor, an insulating film having a contact plug buried therein for connection to a diffusion layer of the transistor, and a ferroelectric capacitor formed on the insulating film and connected to the transistor via the contact plug, the ferroelectric capacitor includes a lower electrode, ferroelectric film formed on the lower electrode and having the same area as that of the lower electrode, upper electrode formed on the ferroelectric film and having a smaller area than that of the ferroelectric film, and protective film formed on side surfaces of the upper electrode in self alignment therewith to cover the surface of the ferroelectric film.

By thus making the protective film on the side walls of the upper electrode in self alignment therewith in the COP (capacitor on plug) structure forming the ferroelectric capacitor on the contact plug, the structure with the ferroelectric film having fringes can be obtained in a single process of lithography. This fringed structure prevents deterioration of the ferroelectric property in the fabrication process.

The present invention is also characterized in that, in a semiconductor device which comprises a semiconductor substrate, a ferroelectric capacitor including a lower electrode, ferroelectric film and upper electrode sequentially stacked on the semiconductor substrate via an insulating film, and a wiring formed on the ferroelectric capacitor via an inter-layer insulating film for connection to the upper electrode, the wiring is configured to contact the upper electrode with a contact area not less than 50% of the area of the upper electrode.

By thus increasing the contact area with the upper electrode, the ferroelectric property is effectively recovered by recovery annealing in the process of making the contact hole, and an excellent ferroelectric capacitor can be obtained.

In the present invention, the hydrogen barrier film formed on the capacitor can be used also as a stopper in the process for leveling the inter-layer insulating film on the hydrogen barrier film. Additionally, in a film structure stacking $Si_xN_y$ or $Si_xO_yN_z$ on the hydrogen barrier film, better stopping function is expected during CMP (chemical mechanical polishing).

As reviewed above, according to the invention, it is possible to obtain a semiconductor device having a ferroelectric capacitor excellent property by preventing or minimizing characteristic deterioration of the ferroelectric capacitor due to reduction by hydrogen in the fabricating process.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DETAILED DESCRIPTION OF THE PREFERRED EMBODIMENTS

Figure 1:
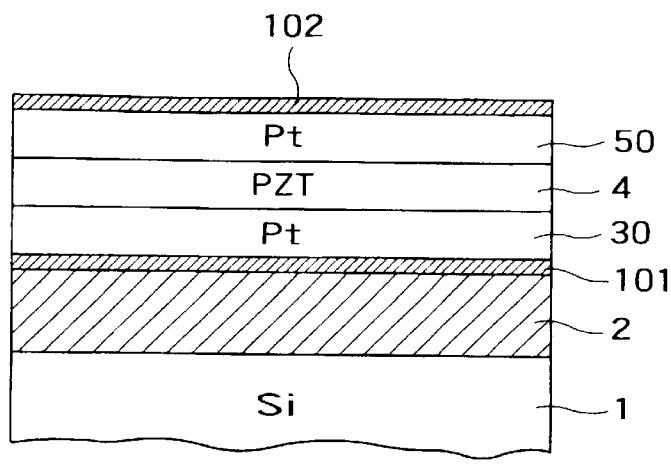
FIG. 1 is a diagram showing a manufacturing process of a ferroelectric capacitor of ferroelectric random access memory according to the first embodiment of the invention.

Referring to the drawings, embodiments of the invention are explained below.

(First Embodiment)

FIGS. 1 through 5 are cross-sectional views showing a manufacturing process of a ferroelectric capacitor of ferroelectric random access memory according to the first embodiment of the invention. As shown in FIG. 1, after a transistor (not shown) is made on the silicon substrate 1, its surface is covered by an inter-layer insulating film 2 of silicon oxide, for example, to level it. On the inter-layer insulating film 2, an aluminum oxide film ($Al_2O_3$ film) 101 is stacked as a hydrogen barrier film commonly used as an adhesion layer by sputtering, for example, to the thickness of about 10 nm, and a lower Pt electrode film 30, approximately 100 nm thick, is stacked thereon by sputtering, for example. On the lower Pt electrode film 30, a PZT film 4, about 150 nm thick, is stacked by sputtering or sol-gel technique, for example. After that, the PZT film 4 is processed by RTA (rapid thermal annealing) in an oxygen atmosphere of 650° C., for example, to crystallize it.

In the crystallization process, the $Al_2O_3$ film 101 prevents diffusion of Pb from the PZT film 4 to the base inter-layer insulating film 2. Therefore, control of Pb concentration of the PZT film 4 is easy, and deterioration of the transistor property by diffusion of Pb into the inter-layer insulating film 2 is prevented.

Figure 2:
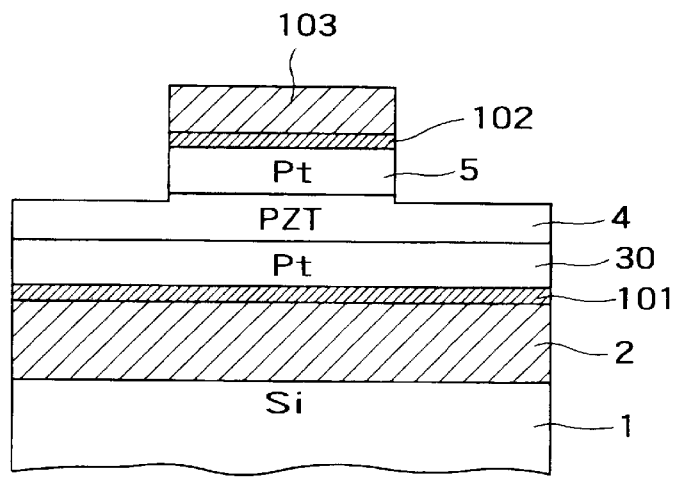
FIG. 2 is a diagram showing a manufacturing process of the ferroelectric capacitor of ferroelectric random access memory according to the first embodiment of the invention.

On the PZT film 4 after crystallization, an upper Pt electrode film 50 of approximately 50 nm is stacked by sputtering, and an $Al_2O_3$ film 102 is stacked thereon to the thickness of about 10 nm as a hydrogen barrier film commonly used as an adhesion layer. This $Al_2O_3$ film 102 can be in an amorphous state. As shown in FIG. 2, further stacked on the $Al_2O_3$ film 102 is a $SiO_2$ film (or $SiN_x$ film) 103 as a hard mask material film as shown in FIG. 2 by plasma CVD. Then a resist pattern (not shown) is made, the $SiO_2$ film 103 is patterned, and the upper PT electrode 5 is patterned consecutively. The $SiO_2$ film 103 is stacked to a thickness 1.2 times to 4 times of the upper Pt electrode 5.

The $Al_2O_3$ film 102 functions not only to ensure adhesion of the hard mask material film but also to protect the capacitor material film from damage in the process for stacking the hard mask material film.

According to experiments by the Inventors, metal oxide films having a hydrogen diffusion constant not higher than $10^{-5}$ cm$^2$/s are desirable as the hydrogen barrier film under the lower Pt electrode film 30 and the hydrogen barrier film on the upper Pt electrode, and it has been confirmed that similar effects are obtained even by using at least one of other various metal oxide films such as $Al_xO_y$ film, $Al_xSi_yO_z$ film, AlN film, WN film, $SrRuO_3$ film, $Ir_xO_y$ film, $Ru_xO_y$ film, $Re_xO_y$ film, $Os_xO_y$ film, $Zr_xO_y$ film and MgxOY film and that such effects are ensured with its thickness not less than 1 nm.

Figure 3:
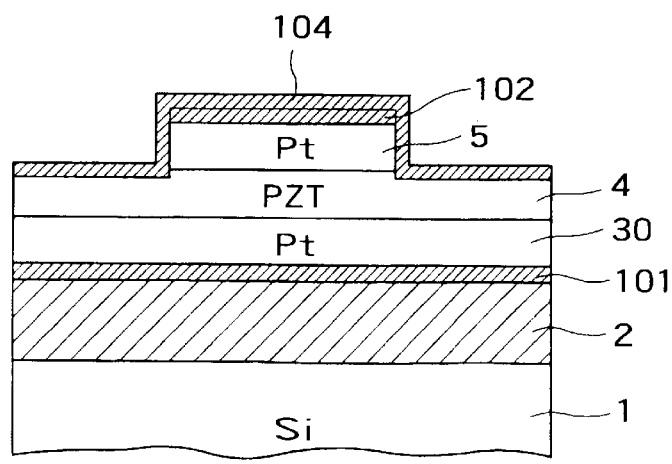
FIG. 3 is a diagram showing a manufacturing process of the ferroelectric capacitor of ferroelectric random access memory according to the first embodiment of the invention.
Figure 4:
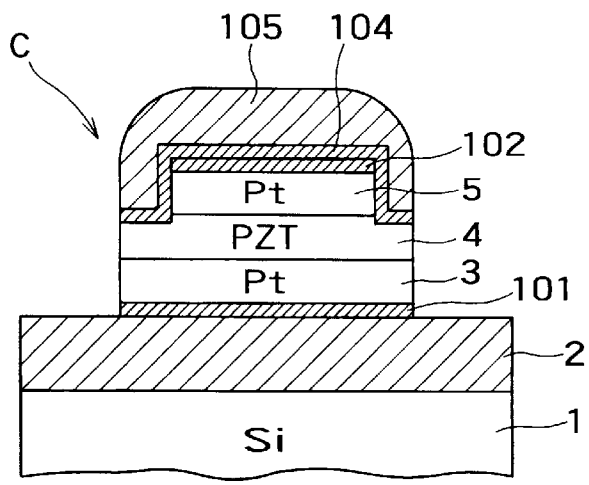
FIG. 4 is a diagram showing a manufacturing process of the ferroelectric capacitor of ferroelectric random access memory according to the first embodiment.

After that, as shown in FIG. 3, the oxide film 103 is removed, and an $Al_2O_3$ film 104, about 10 nm thick, is again stacked as a hydrogen barrier film to cover the patterned upper Pt electrode 5 and exposed PZT film 4. In this step, the oxide film 103 can alternatively be left between the $Al_2O_3$ films 102 and 104. Then, as shown in FIG. 4, a $SiO_2$ film (or $SiN_x$ film) 105 is stacked by plasma CVD, and patterned as a hard mask covering the upper Pt electrode 5. Here again, the $Al_2O_3$ film 104 functions not only to ensure adhesion with the hard mask material film but also to protect the capacitor material film from damage in its stacking process. It is also possible to use, instead of the $Al_2O_3$ film 104, at least one of other various metal oxide films such as $Al_xO_y$ film, $Al_xSi_yO_z$ film, AlN film, WN film, $SrRuO_3$ film, $Ir_xO_y$ film, $Ru_xO_y$ film, $Re_xO_y$ film, $Os_xO_y$ film, $Zr_xO_y$ film and $Mg_xO_y$ film. In this case, however, a high resistance is required, and it is preferable to use, in addition to $Al_2O_3$, at least one of $Al_xO_y$, $Al_xSi_{Oz}$, $Zr_xO_y$ and $Mg_xO_y$ film, for example, as a metal oxide having a specific resistance not lower than 1 k$\Omega$cm.

Figure 5:
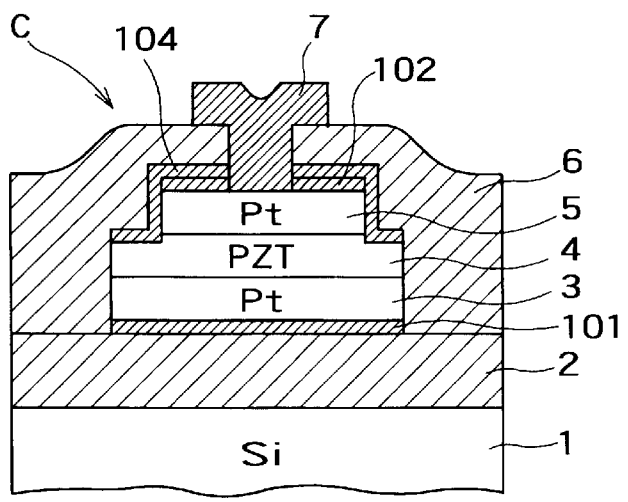
FIG. 5 is a diagram showing-a manufacturing process of the ferroelectric capacitor of ferroelectric random access memory according to the first embodiment.

Then, using the $SiO_2$ film 105 as a mask, the $Al_2O_3$ film 104, PZT film 4 and lower Pt electrode 3 are patterned to obtain a ferroelectric capacitor C. At that time, the $Al_2O_3$ film 101 under the lower Pt electrode 3 is also patterned. The ferroelectric capacitor C is patterned, as illustrated, such that the PZT film 4 and the lower Pt electrode 3 have a larger area than the upper Pt electrode 5. Thereafter, after removing the $SiO_2$ film 105, or while maintaining it, an inter-layer insulating film 6 is stacked as shown in FIG. 5, a contact hole is made, and a terminal wiring 7 is made. Prior to stacking the inter-layer insulating film 6, an $Al_2O_3$ film may be stacked again to cover the entire ferroelectric capacitor.

According to the invention, by using a metal oxide film not containing titanium, such as $Al_2O_3$, as the hydrogen barrier film also functioning to adhesion, it is possible to obtain ferroelectric random access memory with an excellent property, which is less likely to deteriorate in ferroelectric property and transistor property as compared with one using a film of a material containing titanium like $Ti_xO_y$, TiN, etc. That is, diffusion of hydrogen into the capacitor region is effectively blocked by the $Al_2O_3$ hydrogen barrier film. Additionally, the PZT film has almost no contact with the inter-layer insulating film, and outward diffusion of Pb is prevented. Further, since Ti is not used, there is no diffusion of titanium into the PZT film, and an excellent property is obtained. Furthermore, the use of $Al_2O_3$ film 102 is effective to prevent damage during formation of the mask material 103 thereon.

If Ti is employed as the material of the hydrogen barrier film, the problem that the ferroelectric film such as PZT may be deoxidized by Ti may arise. In that case, Ti is oxidized and forms a $Ti_xO_y$ layer having a relatively low dielectric constant. If such a $Ti_xO_y$ layer is formed between the ferroelectric film and the electrode of the capacitor, the voltage applied to the ferroelectric film decreases so that the resultant decrease of the polarization charge takes place.

Although this embodiment uses three layers of the hydrogen barrier film to extend over the upper and lower surfaces and over the upper electrode to side surfaces from the upper electrode. However, when only one or two of these layers are used, a certain effect is ensured.

(Second Embodiment)

Figure 6:
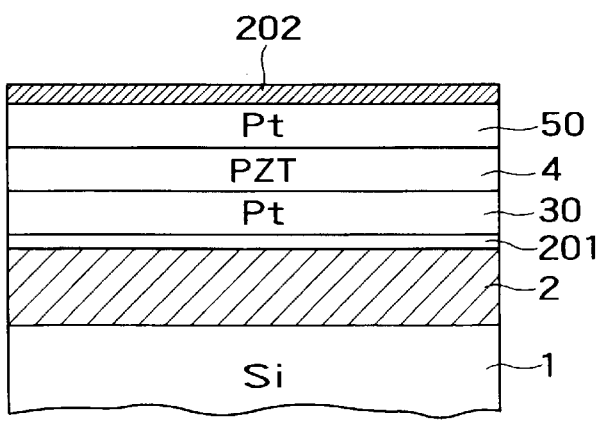
FIG. 6 is a diagram showing a manufacturing process of a ferroelectric capacitor of ferroelectric random access memory according to the second embodiment of the invention.

FIGS. 6 through 11 are cross-sectional views showing a manufacturing process of a ferroelectric capacitor of ferroelectric random access memory according to the second embodiment of the invention. In this embodiment, a hydrogen barrier film is made merely on the upper surface of the upper electrode of the ferroelectric capacitor. First as shown in FIG. 6, after a transistor (not shown) is made on the silicon substrate 1, its surface is covered by an inter-layer insulating film 2 of silicon oxide, for example, to level it. On the inter-layer insulating film 2, a lower Pt electrode film 30, approximately 100 nm thick, is stacked thereon by sputtering, for example, via an adhesion layer 201 not containing titanium. On the lower Pt electrode film 30, a PZT film 4, about 150 nm thick, is stacked by sputtering or sol-gel technique, for example. After that, the PZT film 4 is processed by RTA (rapid thermal annealing) in an oxygen atmosphere of 650° C., for example, to crystallize it.

On the PZT film 4, an upper Pt electrode film 50 of approximately 50 nm is stacked, and a hydrogen barrier film 202 is stacked thereon to the thickness of about 10 nm as a hydrogen barrier film commonly used as an adhesion layer. Metal oxide films having a hydrogen diffusion constant not higher than $10^{-5}$ cm$^2$/s are desirable as the hydrogen barrier film 202, and an aluminum oxide ($Al_2O_3$) film is representative one of such films. Otherwise, at least one of $Al_xO_y$ film, $Al_xSi_yO_z$ film, AlN film, WN film, $SrRuO_3$ film, $Ir_xO_y$ film, $Ru_xO_y$ film, $Re_xO_y$ film, $Os_xO_y$ film, $Mg_xO_y$ film and $Zr_xO_y$ film may be used.

Figure 7:
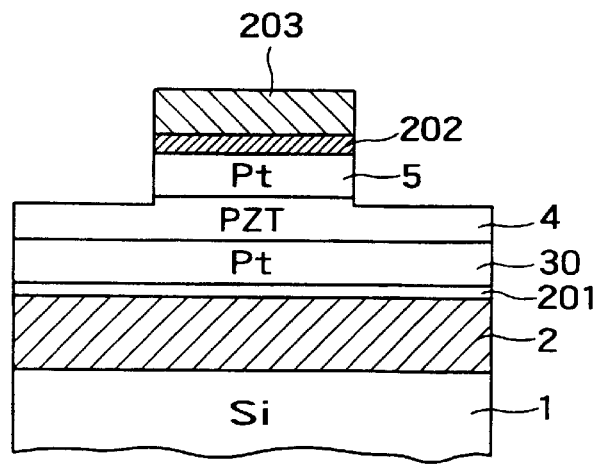
FIG. 7 is a diagram showing a manufacturing process of the ferroelectric capacitor of ferroelectric random access memory according to the second embodiment of the invention.

As shown in FIG. 7, stacked on the hydrogen barrier film 202 is a silicon nitride film ($Si_xN_y$ film) 203 (or $Si_xO_yN_z$ film) as a hard mask material by plasma CVD. In this process of stacking the insulating film, the hydrogen barrier film 202 protects the underlying layer from plasma by plasma CVD, and improves the adherence of the insulating film.

Figure 8:
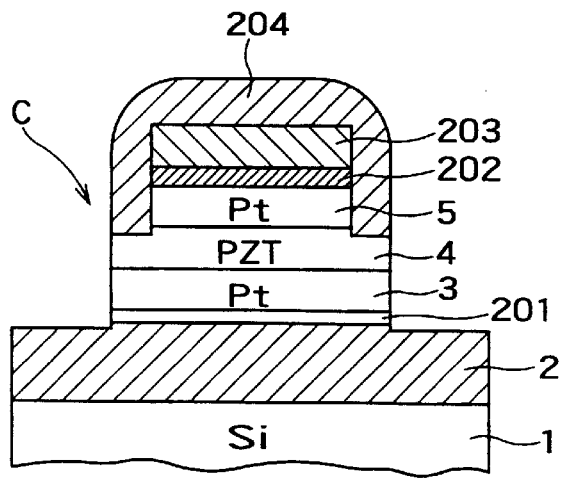
FIG. 8 is a diagram showing a manufacturing process of the ferroelectric capacitor of ferroelectric random access memory according to the second embodiment of the invention.

After that, a resist pattern (not shown) is made on the $Si_xN_y$ film 203, and using the resist pattern, the $Si_xN_y$ film 203 is processed by etching. Using the patterned $Si_xN_y$ film 203 as a mask, the $Al_2O_3$ film 202 and the upper Pt electrode 5 are processed by etching as shown in FIG. 5. Further, as shown in FIG. 8, a hard mask 204 of $SiO_2$, for example, is made and patterned to cover the upper Pt electrode 5, and using it, the PZT film 4 and the lower Pt electrode film 30 are processed by etching. As a result, a ferroelectric capacitor C having the PZT film 4 self-aligned with and wider than the lower Pt electrode 3 is obtained. After that, an $Al_2O_3$ film may be formed on the entire surface (not shown).

Figure 9:
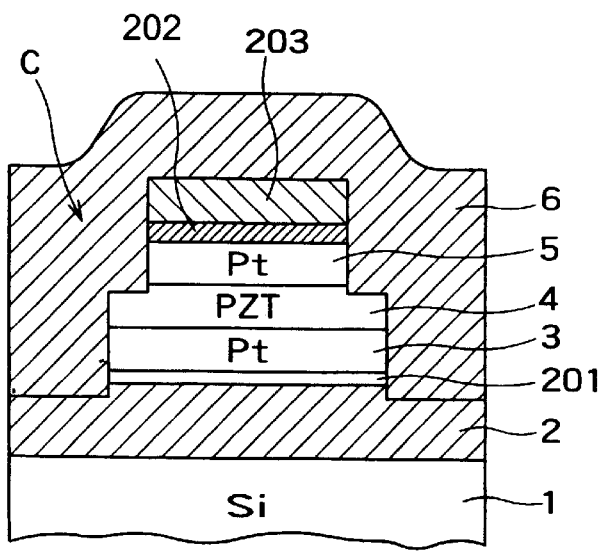
FIG. 9 is a diagram showing a manufacturing process of the ferroelectric capacitor according to the same embodiment.
Figure 10:
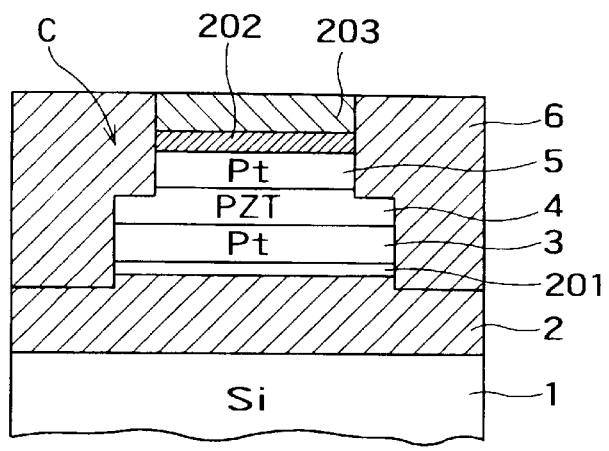
FIG. 10 is a diagram showing a manufacturing process of the ferroelectric capacitor according to the same embodiment.

After that, as shown in FIG. 9, an inter-layer insulating film 6 of $SiO_2$ is stacked to cover the ferroelectric capacitor. Then, by CMP, the inter-layer insulating film 6 is smoothed. At that time, the $Si_xN_y$ film 203 serves as a stopper of the smoothing process, and the leveled structure shown in FIG. 10 is obtained.

Figure 11:
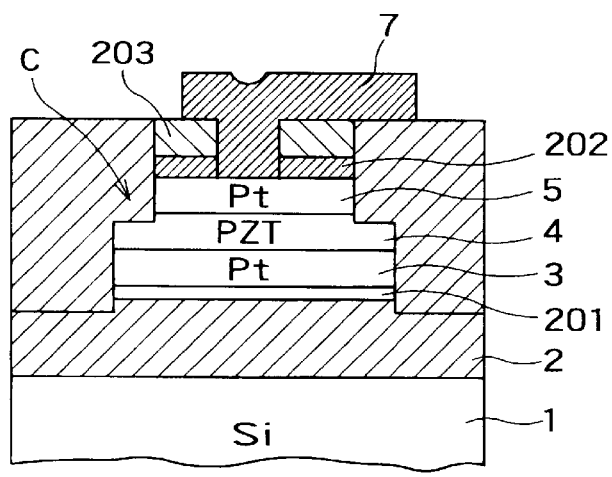
FIG. 11 is a diagram showing a manufacturing process of the ferroelectric capacitor according to the same embodiment.

After that, a contact hole is made as shown in FIG. 11, and a terminal wiring 7 is formed for connection to the upper Pt electrode 5.

Also in this embodiment, the hydrogen barrier film covering the upper Pt electrode prevents diffusion of hydrogen into the PZT film, and an excellent ferroelectric capacitor property is obtained. Further, in case of this embodiment, the hydrogen barrier film is patterned simultaneously with the upper Pt electrode by the SiN film formed thereon as the hard mask. Then, the hard mask is maintained and used as the stopper for the later smoothing process for more perfect leveling after fabrication of the capacitor. Moreover, since Ti is not used, an excellent property is obtained without diffusion of titanium into the PZT film.

(Third Embodiment)

Figure 12:
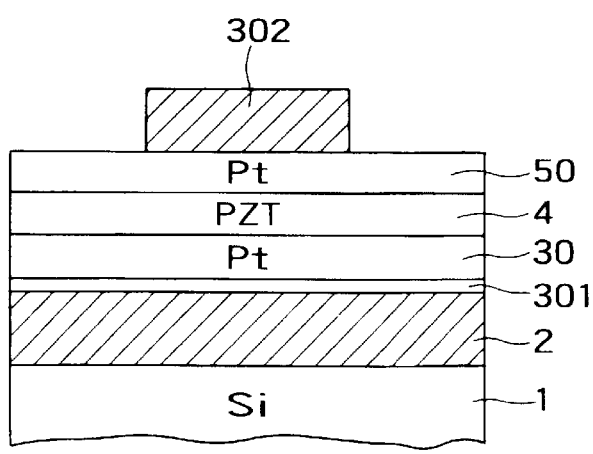
FIG. 12 is a diagram showing a manufacturing process of a ferroelectric capacitor of ferroelectric random access memory according to the third embodiment of the invention.

FIGS. 12 through 16 are cross-sectional views showing a manufacturing process of a ferroelectric capacitor of ferroelectric random access memory according to the third embodiment of the invention. In this embodiment, a hydrogen barrier film is made to cover and extend over the upper surface, its side surfaces, side surfaces of the ferroelectric film and upper surface of the lower electrode. As shown in FIG. 12, after a transistor (not shown) is made on the silicon substrate 1, its surface is covered by an inter-layer insulating film 2 of silicon oxide, for example, to level it. On the inter-layer insulating film 2, a lower Pt electrode film 30, approximately 100 nm thick, is stacked thereon by sputtering, for example, via an adhesion layer 301 not containing titanium. On the lower Pt electrode film 30, a PZT film 4, about 150 nm thick, is stacked by sputtering or sol-gel technique, for example. After that, the PZT film 4 is processed by RTA (rapid thermal annealing) in an oxygen atmosphere of 650° C., for example, to crystallize it. On the PZT film 4, an upper Pt electrode film 50 of approximately 50 nm is stacked.

Figure 13:
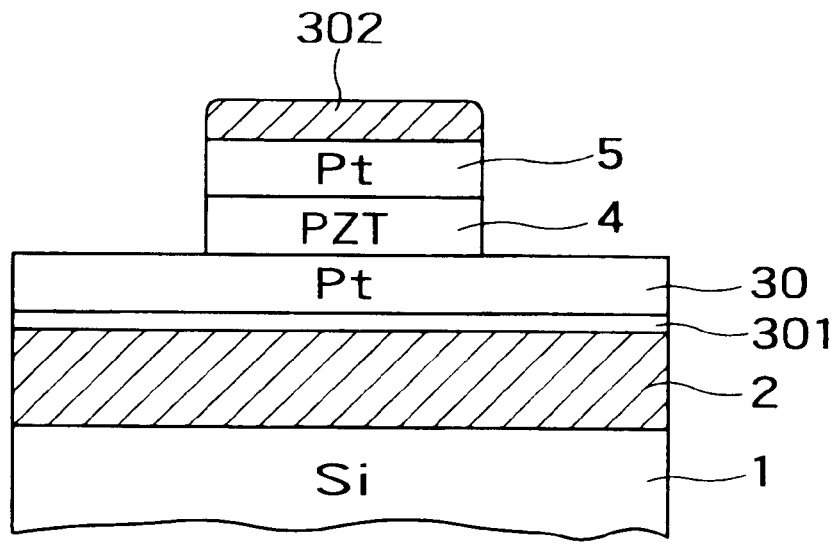
FIG. 13 is a diagram showing a manufacturing process of the ferroelectric capacitor of ferroelectric random access memory according to the third embodiment of the invention.

On the upper Pt electrode film 50, a $SiO_2$ film 302 is stacked by plasma CVD, and this $SiO_2$ film 302 is patterned as a hard mask. Then as shown in FIG. 13, the upper Pt electrode film 5 and the PZT film 4 are sequentially processed by etching. This etching is conducted until etching a part of the surface of the lower Pt electrode film 30.

Figure 14:
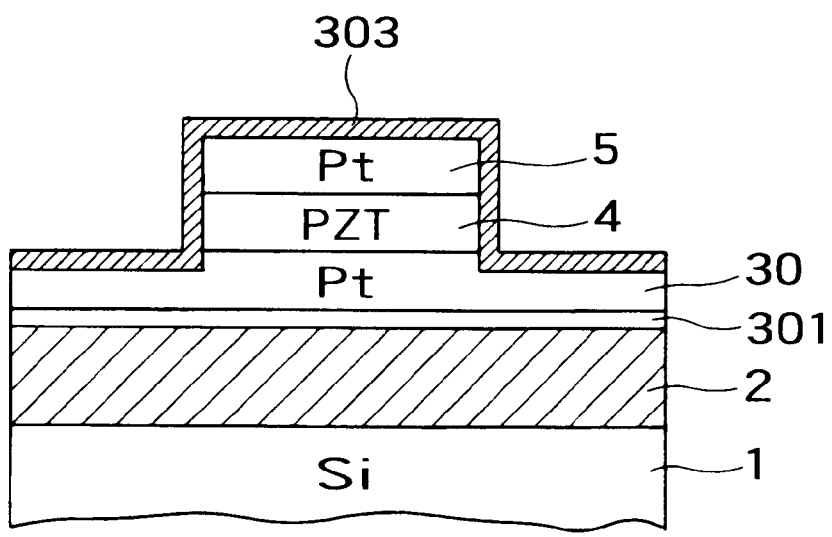
FIG. 14 is a diagram showing a manufacturing process of the ferroelectric capacitor of ferroelectric random access memory according to the third embodiment of the invention.

Then, after the $SiO_2$ film 302 used as the mask is removed, a hydrogen barrier film 303 is stacked as shown in FIG. 14. The hydrogen barrier film 303 is preferably a film having a hydrogen diffusion constant not higher than $10^{-5}$ cm$^2$/s. An aluminum oxide ($Al_2O_3$) film is representative one of such films. In this case, however, the hydrogen barrier film used here is required to have a high resistance is required, and from this viewpoint, it is preferable to use at least one of $Al_xO_y$, $Al_xSi_yO_z$, $Zr_xO_y$ and $Mg_xO_y$ film, for example, as a metal oxide having a specific resistance not lower than 1 kΩcm.

Figure 15:
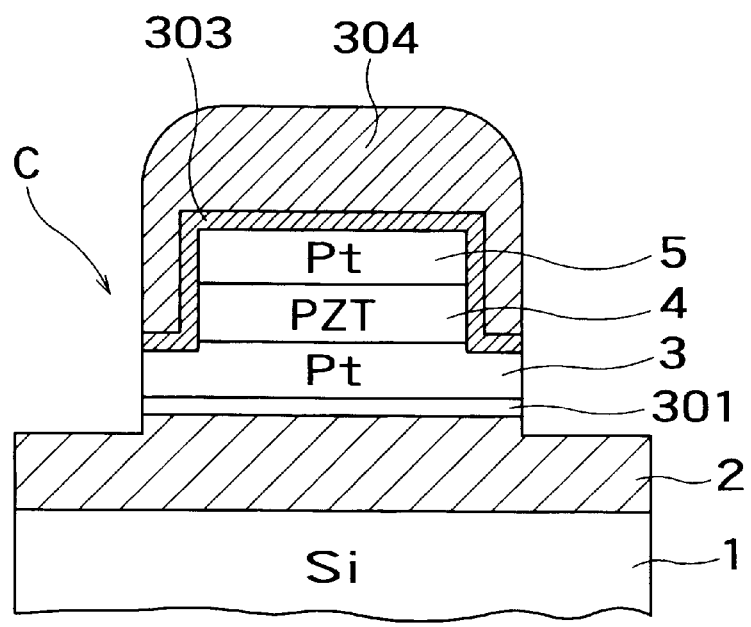
FIG. 15 is a diagram showing a manufacturing process of the ferroelectric capacitor according to the same embodiment.
Figure 16:
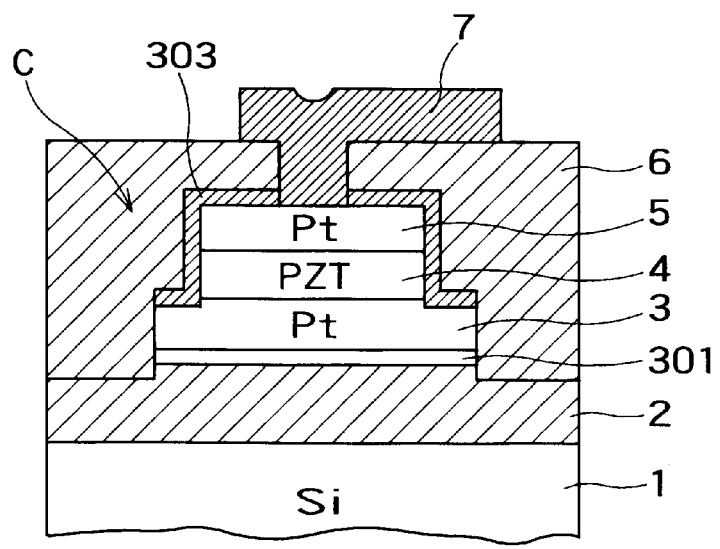
FIG. 16 is a diagram showing a manufacturing process of the ferroelectric capacitor according to the third embodiment.

After that, as shown in FIG. 15, a hard mask of $SiO_2$ film 304 covering the capacitor region is again patterned, and using this mask, the hydrogen barrier film 303, the lower Pt electrode film 3 and adhesion layer 301 are processed by etching to make up the ferroelectric capacitor C. Then, the mask is removed, and as shown in FIG. 16, an inter-layer insulating film 6 is stacked. a contact hole is made, and a terminal wiring 7 is formed.

According to this embodiment, the upper Pt electrode 5 and the PZT film 4 are patterned in self alignment, and the lower Pt electrode 3 is formed to have a larger area than them. Then, the hydrogen barrier film 303 is formed to extend from the upper surface of the upper Pt electrode 5, over side surfaces of the PZT film patterned in self alignment with the upper Pt electrode 5, onto the surface of the lower Pt electrode. As a result, diffusion of hydrogen into the boundary of the PZT film with the lower electrode is prevented in subsequent steps, and an excellent ferroelectric property is obtained. Additionally, since the PZT film does not contact with the inter-layer insulating film, diffusion of Pb is also prevented. Furthermore, since no Ti adhesion layer is used, Ti diffusion into the PZT film does not occur, and an excellent property is obtained.

(Fourth Embodiment)

Figure 17:
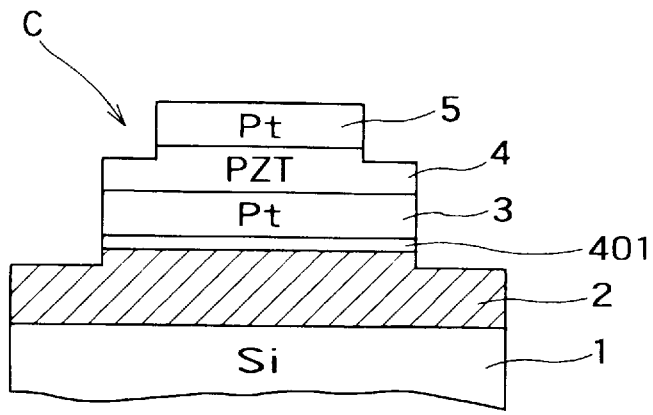
FIG. 17 is a diagram showing a manufacturing process of a ferroelectric capacitor of ferroelectric random access memory according to the fourth embodiment of the invention.

FIGS. 17 through 21A are cross-sectional views showing a manufacturing process of a ferroelectric capacitor of ferroelectric random access memory according to the fourth embodiment of the invention. In this embodiment, a hydrogen barrier film is interposed inside an inter-layer insulting film covering to ferroelectric capacitor so as to surround the ferroelectric capacitor. As shown in FIG. 17, after a transistor (not shown) is made on the silicon substrate 1, its surface is covered by an inter-layer insulating film 2 of silicon oxide, for example, to level it. On the inter-layer insulating film 2, a ferroelectric capacitor C including a lower Pt electrode 3, PZT film 4 and upper Pt electrode 5 is formed on the inter-layer insulating film 2 via an adhesion layer 401.

More specifically, the lower Pt electrode film 3, approximately 100 nm thick, is stacked by sputtering, and the PZT film 4, approximately 150 nm, thick is stacked thereon by sputtering or sol-gel technique. After that, the PZT film 4 is processed by RTA (rapid thermal annealing) in an oxygen atmosphere of 650° C., for example, to crystallize it. On the PZT film 4, an upper Pt electrode film 5 of approximately 50 nm is stacked. Then, these films are sequentially processed by etching to make up the ferroelectric capacitor C. At that time, although not shown, using a first mask material, the upper Pt electrode film 5 is etched, and the PZT film 4 and the lower Pt electrode film 3 are etched by using a second mask material.

Figure 18:
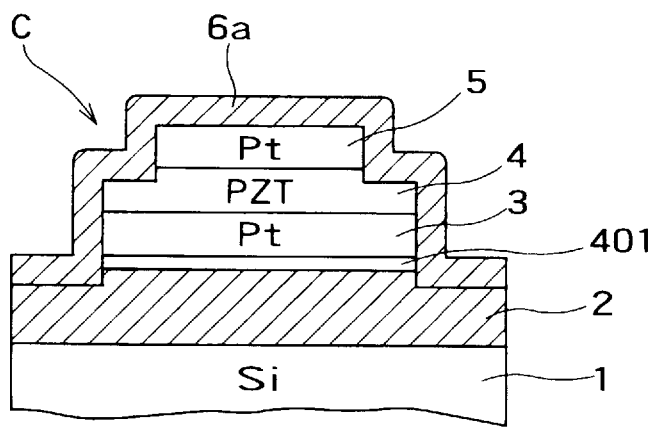
FIG. 18 is a diagram showing a manufacturing process of the ferroelectric capacitor of ferroelectric random access memory according to the fourth embodiment of the invention.
Figure 19:
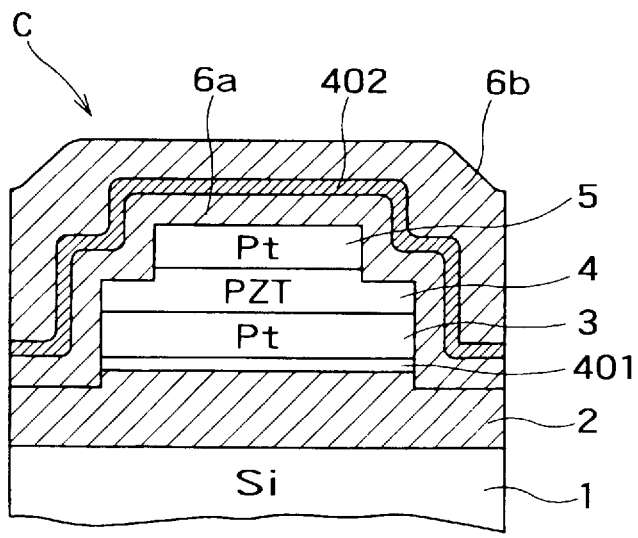
FIG. 19 is a diagram showing a manufacturing process of the ferroelectric capacitor according to the same embodiment.

As shown in FIG. 18, a thin inter-layer insulating film 6a is stacked to cover the patterned ferroelectric capacitor C. on the inter-layer insulating film 6a, a hydrogen barrier film 402 is stacked as shown in FIG. 19, and an inter-layer insulating film 6b is stacked. That is, inter-layer insulating films 6a, 6b sandwiching the hydrogen barrier film 402 therebetween are formed. In case of this embodiment, when the thickness of the inter-insulating film 6a is determined not to exceed 0.02 times through two times of the thickness of the upper Pt electrode 5, PZT film 4, lower Pt electrode 3, etc., or not to exceed 0.05 times through three times of the thickness of the ferroelectric capacitor, the hydrogen barrier film 402 can be stacked with a good coverage. Finally, as shown in FIG. 20A, a contact hole is made, and a terminal wiring 7 for connection to the upper Pt electrode 5 is made.

Also in this embodiment, as the hydrogen barrier film 402, a metal oxide film having a hydrogen diffusion constant of $10^{-5}$ cm$^2$/s or less and preferably has a specific resistance not lower than 1 kΩcm is desirable, and representative one of such films is an $Al_2O_3$ film. By interposing the hydrogen barrier film inside the inter-layer insulating film in this manner, deterioration of the performance of the ferroelectric capacitor is prevented. The hydrogen banner film inside the inter-layer insulating film also functions to protect the ferroelectric capacitor from damage in a final process of stacking a passivation film (normally a $SiN_x$ film) to cover the top surface of the device. Further, the inter-layer insulating film 6a functions to prevent interaction between the hydrogen barrier film and the ferroelectric capacitor C by direct contact thereof. Furthermore, the embodiment provided the effect of preventing diffusion of Pb out of the PZT film, and the effect of preventing diffusion of Ti into the PZT film because Ti is not used. Additionally, since the $Al_2O_3$ film is an insulating film, it can be inserted in the entire area of the inter-insulating film without patterning, and short-circuiting of a contact to the diffusion layer does not occur.

In case of this embodiment, in addition to $Al_2O_3$, at least one of $Al_xO_y$, $Al_xSi_yO_z$, $Ti_xO_y$, $Zr_xO_y$, $Mg_xO_y$ and $Mg_xTi_yO_z$, is effective.

Figure 20A:
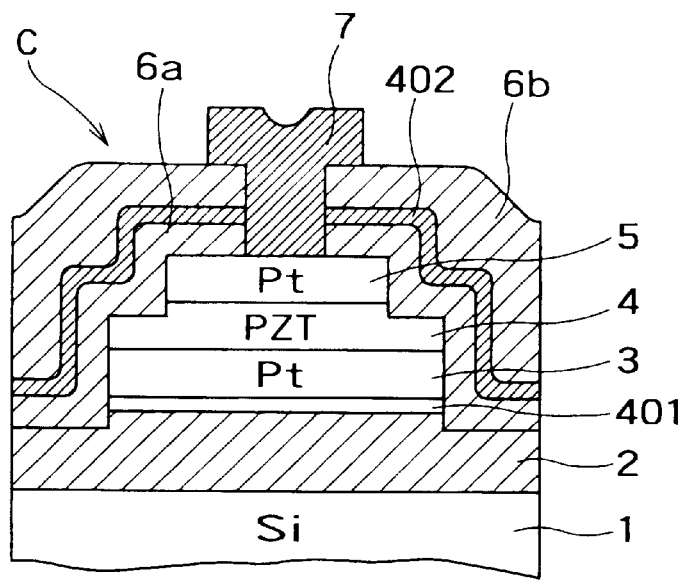
FIG. 20A is a diagram showing a manufacturing process of the ferroelectric capacitor according to the same embodiment.

In the structure shown in FIG. 20A, it is preferable to use an aluminum oxide film as the hydrogen barrier film 402, and silicon oxide films as the first insulating film 6a and the second insulating film 6b. After the capacitor C is made, a $SiO_2$ film (deposition temperature: 300~400° C.) or an ozone TEOS film (deposition temperature: 300~400° C.) by plasma CVD (chemical vapor deposition) is formed as the first insulating film 6a. After that, for the purpose of improving the capacitor property, annealing is preferably conducted in an oxygen atmosphere 500~650° C.

After that, an aluminum oxide film is formed by sputtering. Additionally, for the purpose of improving the insulation of the aluminum oxide film, it is preferably annealed in an oxygen atmosphere of 400° C. Thereafter, a $SiO_2$ film (deposition temperature: 300~400° C.) an ozone TEOS film (deposition temperature: 300~400° C.) by plasma CVD (chemical vapor deposition) is formed as the second insulating film 6b at a lower temperature.

In the structure shown in FIG. 20A, even when the first insulating film 6a is not made, a hydrogen blocking property of the capacitor by the hydrogen barrier film 402 is recognized. However, the structure including the first insulating film 6a as shown in FIG. 20A is more excellent in hydrogen barrier property.

If the hydrogen barrier film 402 ($Al_2O_3$, $Al_xO_y$, $Al_xSi_yO_z$, $Ti_xO_y$, etc.) is stacked directly on the capacitor, oxygen contained in the ferroelectric film 4 is trapped by the hydrogen barrier film 402, and deterioration of the property is liable to occur. Such deterioration of the property is recovered for a while by oxygen annealing. However, when the process progresses to a step not including oxygen annealing, if a reducing gas such as hydrogen again reaches the hydrogen barrier film 402, a certain portion in the hydrogen barrier film is reduced, and the reduced element (Al, Ti) traps oxygen of the ferroelectric film 4 and deteriorates its property.

In contrast, when the first insulating film 6a is made as shown in FIG. 20A, since the first insulating film 6a blocks the reduced element (Al, Ti), or reduces it instead of the ferroelectric film 4, deterioration of the property does not occur.

The aluminum oxide film made under the temperature range of 400~700° C. is amorphous and excellent in property of trapping hydrogen, but it is liable to be reduced by hydrogen. As the first insulating film 6a, a silicon oxide film, or a silicon oxide film containing nitrogen, is suitable from the viewpoint of its coverage, generality, convenience and unlikeliness to exfoliate from above the capacitor. If these requirements are satisfied, any other material may be used.

As explained above, according to the structure shown in FIG. 20A, although it is necessary to make the hydrogen barrier film with a material which blocks (or traps) hydrogen, since a certain degree of reduction is acceptable, the margin increases, and reliability of the device is improved.

The method for making the first insulating film 6a is desired to satisfy the requirements: (1) the atmosphere is unlikely to generate hydrogen radicals or does not generate much; (2) the temperature is low (preferably not higher than 400° C.); (3) the stacked film is not too thick beyond a required thickness (because deterioration by hydrogen radicals will occur during deposition and. because the patterning and/or opening of the film become more difficult as the thickness becomes greater); and (4) taking its coverage into consideration, its thickness is thicker than 0.05 times and smaller than three times of the thickness of the capacitor (sum of the upper electrode 5, ferroelectric film 4 and lower electrode 3 (including a barrier metal)).

Figure 20B:
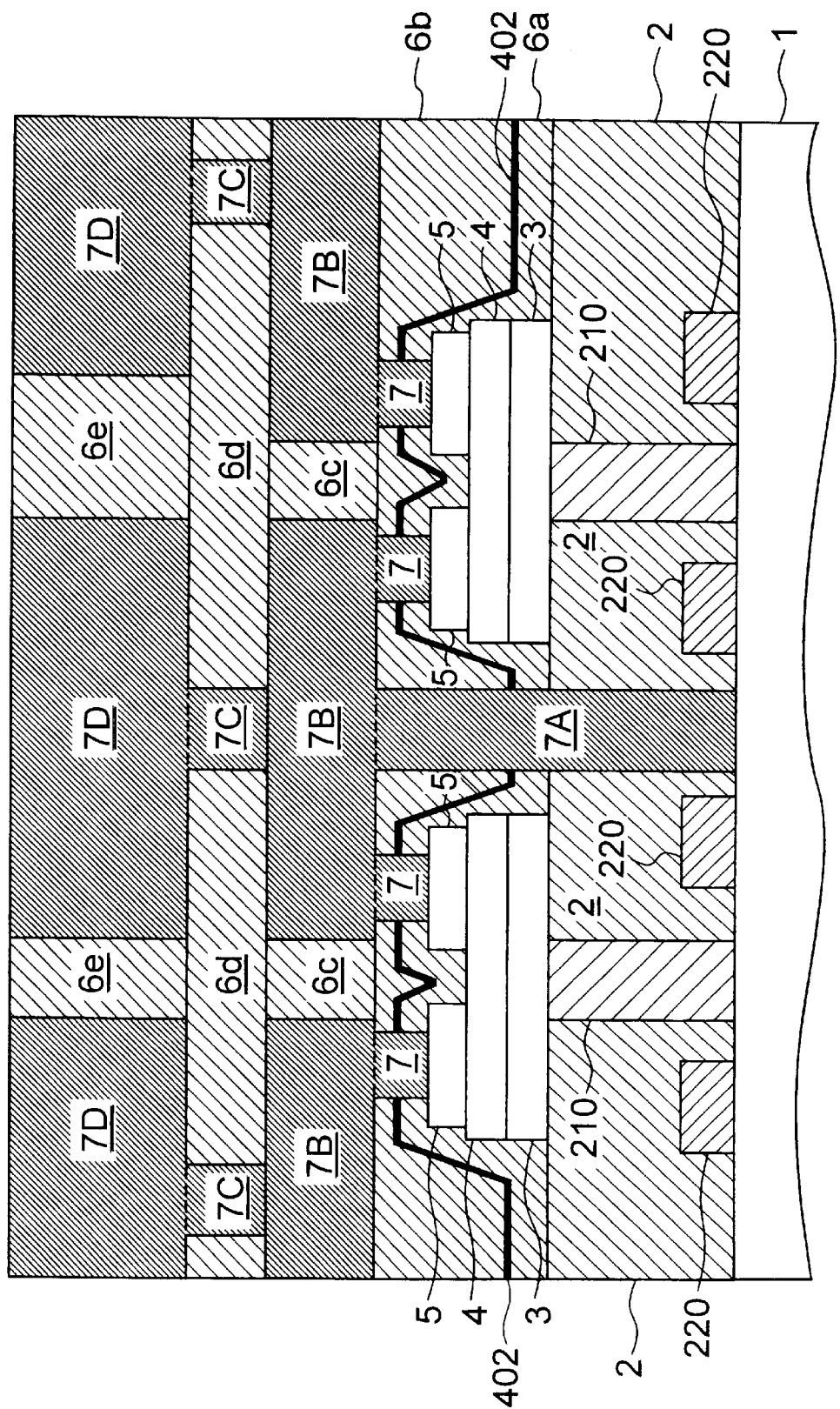
FIG. 20B a cross-sectional view schematically showing a concrete example of ferroelectric random access memory in which capacitors shown in FIG. 20A are connected in series.
Figure 20C:
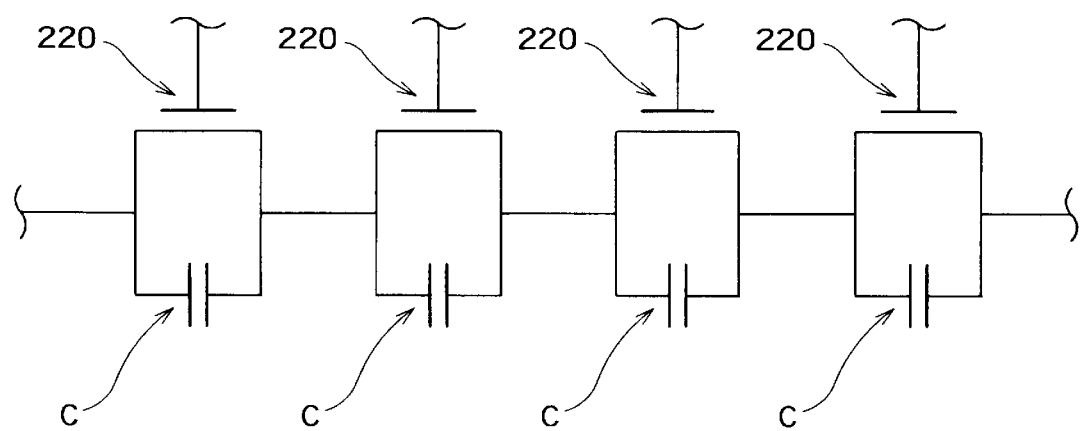
FIG. 20C shows the equivalent circuit of the ferroelectric random access memory shown in FIG. 20B.

FIG. 20B is a cross-sectional view schematically showing a concrete example of ferroelectric random access memory in which capacitors shown in FIG. 20A are connected in series. FIG. 20C is its equivalent circuit.

Ferroelectric random access memory shown here is made by stacking a plurality of capacitors having the structure shown in FIG. 20A. A pair of adjacent capacitors commonly share the lower electrode 3. The upper electrode 5 and the terminal wiring 7 are formed in each capacitor independently. The lower electrode 3 is connected to the silicon substrate 1 by a plug wiring 210 made of polysilicon or tungsten (W), for example. On the capacitors, an aluminum wiring layer 7B is formed in the common level to the inter-layer insulating film 6c. This wiring layer 7B is connected to the overlying wiring layer 7D by metal plugs 7C. The wiring layer 7D is separated by inter-layer insulating film 6e. On the other hand, the silicon substrate 1 and the wiring layer 7B are connected by a metal plug 7A.

This ferroelectric random access memory made in this manner has the structure as shown in FIG. 20C in which a plurality of cells each composed of a pair of transistors 220 and a capacitor C connected in parallel are connected in series.

(Fifth Embodiment)

Figure 21:
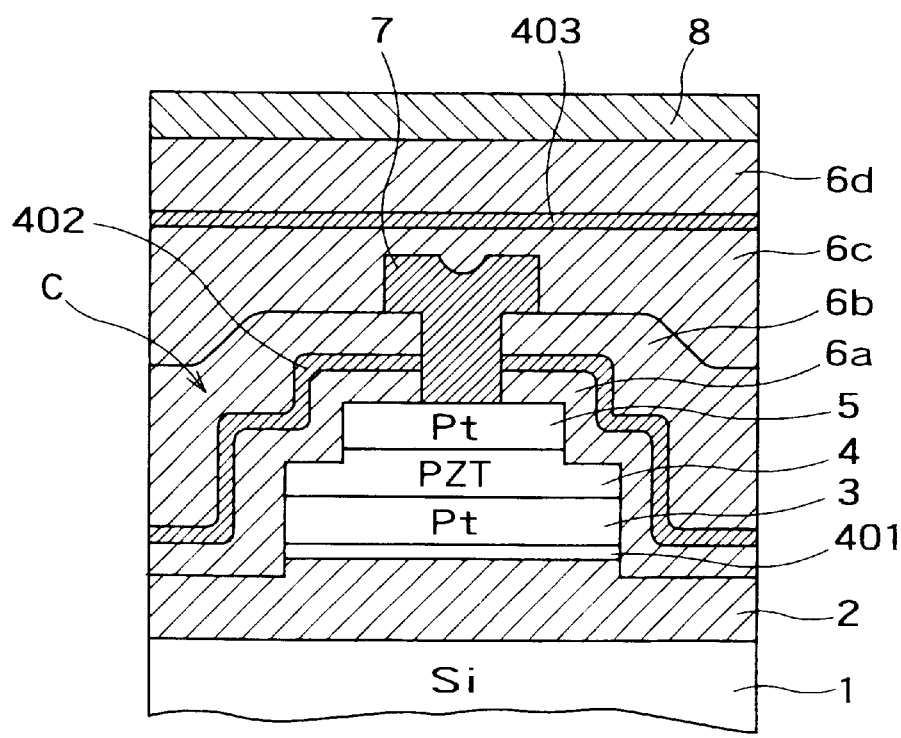
FIG. 21 is a diagram showing the structure of a ferroelectric capacitor of ferroelectric random access memory according to the fifth embodiment of the invention.

FIG. 21 shows a structure stacking further inter-layer insulating films 6c, 6d on the structure obtained by the fourth embodiment, and interposing a hydrogen barrier film 403 between the inter-layer insulating films 6c, 6d upon making a passivation film 8 of SiN. By interposing the hydrogen barrier film in a multi-layered fashion in the inter-layer insulating films in this manner, better effect of preventing hydrogen diffusion is expected. Additionally, it has been confirmed that this structure effective reduces damage by deposition of the passivation film of SiN.

Figure 22:
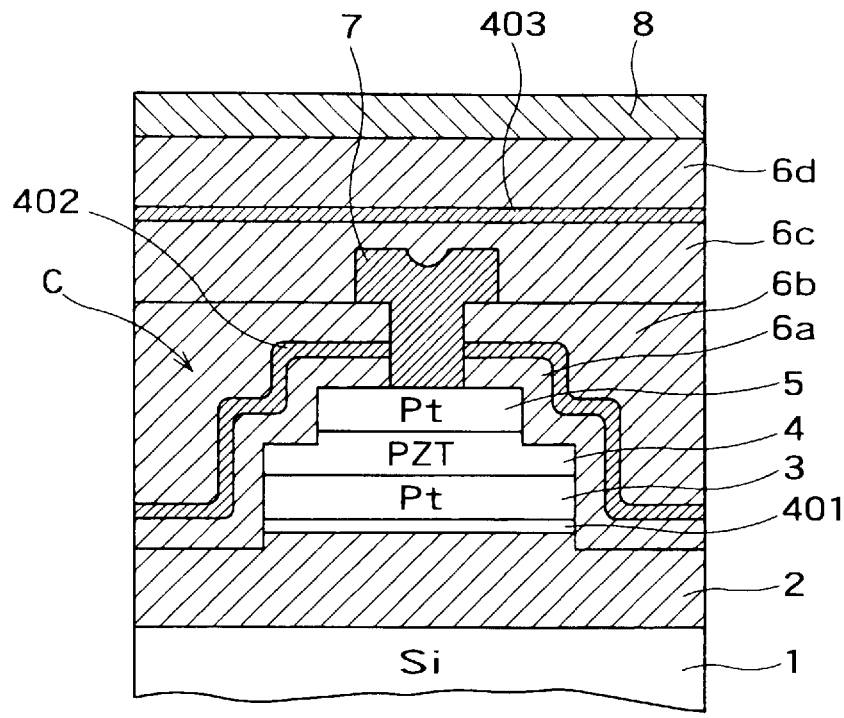
FIG. 22 is a diagram showing a structure modified from the structure of the same embodiment.

FIG. 22 shows a modified structure based on the structure of FIG. 21, where the surface of the inter-layer insulating film 6b is flattened.

Figure 23A:
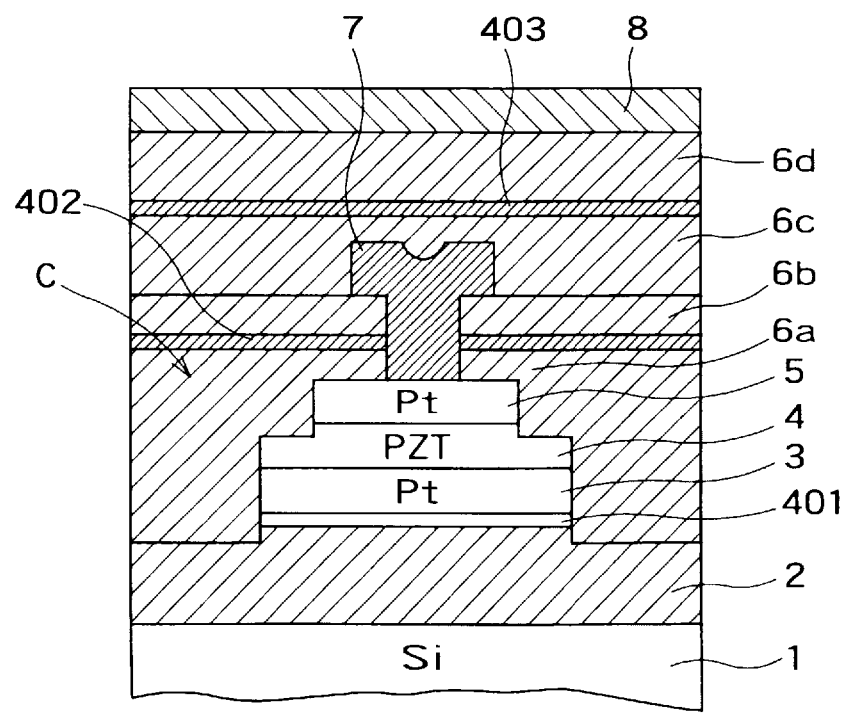
FIG. 23A is a diagram showing structures modified from the structure of the embodiment shown in FIG. 22.

FIG. 23A shows a further modified structure in which the inter-layer insulating film 6a is flattened, and the hydrogen barrier film 402 is formed on the flattened surface.

Figure 23B:
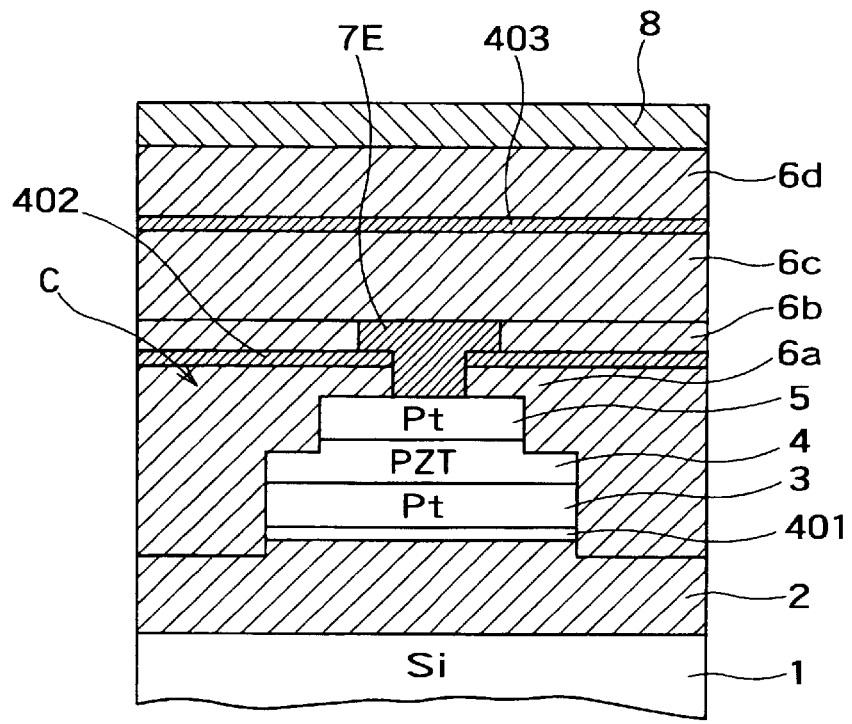
FIG. 23B shows a further modified structure in which a wiring 7E is formed in the common level to the inter-layer insulating film 6b.

FIG. 23B shows a further modified structure in which a wiring 7E is formed in the common level to the inter-layer insulating film 6b. This wiring structure can be formed by deposition and planarization process of aluminum, for example the one called "Damascene process." This structure is advantageous in that the hydrogen barrier film 402 can be as well used as a stopper when forming a wiring groove at the inter-layer insulating film 6b by etching.

Figure 23C:
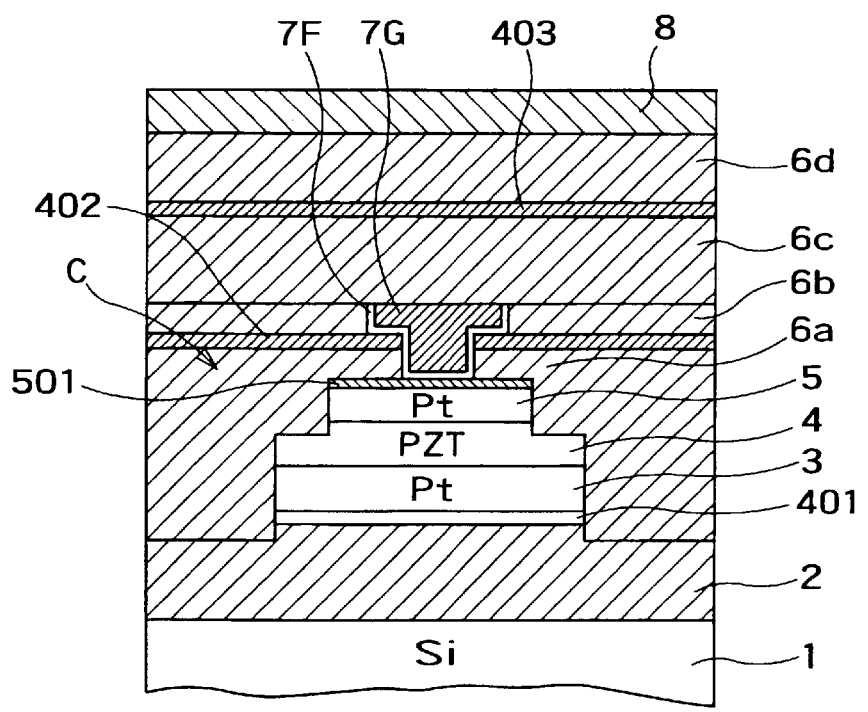
FIG. 23C shows a structure in which a titanium compound film 501 is stacked on the capacitor, and an aluminum wiring 7G formed thereon via a barrier metal layer 7F.

FIG. 23C shows a structure in which a titanium compound film 501 is stacked on the capacitor, and an aluminum wiring 7G formed thereon via a barrier metal layer 7F. The aluminum wiring 7G can be formed by the deposition and planarization process of aluminum such as Damascene process. In this structure, the titanium compound film 501 can be made of $TiO_2$ (or $Ti_xO_y$), for example. The barrier metal layer 7F can be made of titanium nitride ($TiN_x$) or tungsten nitride ($WN_x$). The structure shown in FIG. 23C can prevent "exfoliation" of the inter-layer insulating film 6a from above the upper electrode 5. If a hydrogen barrier film made of $Al_2O_3$, for example, is stacked directly on the upper electrode 5, "exfoliation" of the hydrogen barrier film from the upper electrode 5 can be effectively prevented. Additionally, alloying interaction between the upper electrode 5 of platinum, for example, and the aluminum wiring 7 can be prevented as well.

The structure of FIG. 23C is particularly advantageous when using an aluminum reflow wiring because the substrate is heated in the process of making the reflow wiring, and exfoliation of the inter-layer insulating film 6a from the upper electrode 5 and alloying interaction between the upper electrode 5 and the aluminum wiring 7 are liable to occur.

Also when the titanium compound film 501 as shown in FIG. 23C is provided similarly in the structure shown in FIG. 20B, the same effects are obtained. That is, in the structure shown in FIG. 20B, by making the titanium compound film 501 between the upper electrode 5 and the wiring 7, "exfoliation" of the inter-layer insulating film 6a from the upper electrode 5 and alloying interaction between the upper electrode 5 and the aluminum wiring 7 can be prevented effectively. Therefore, this structure is especially advantageous in ferroelectric random access memory using an aluminum reflow wiring.

Figure 23D:
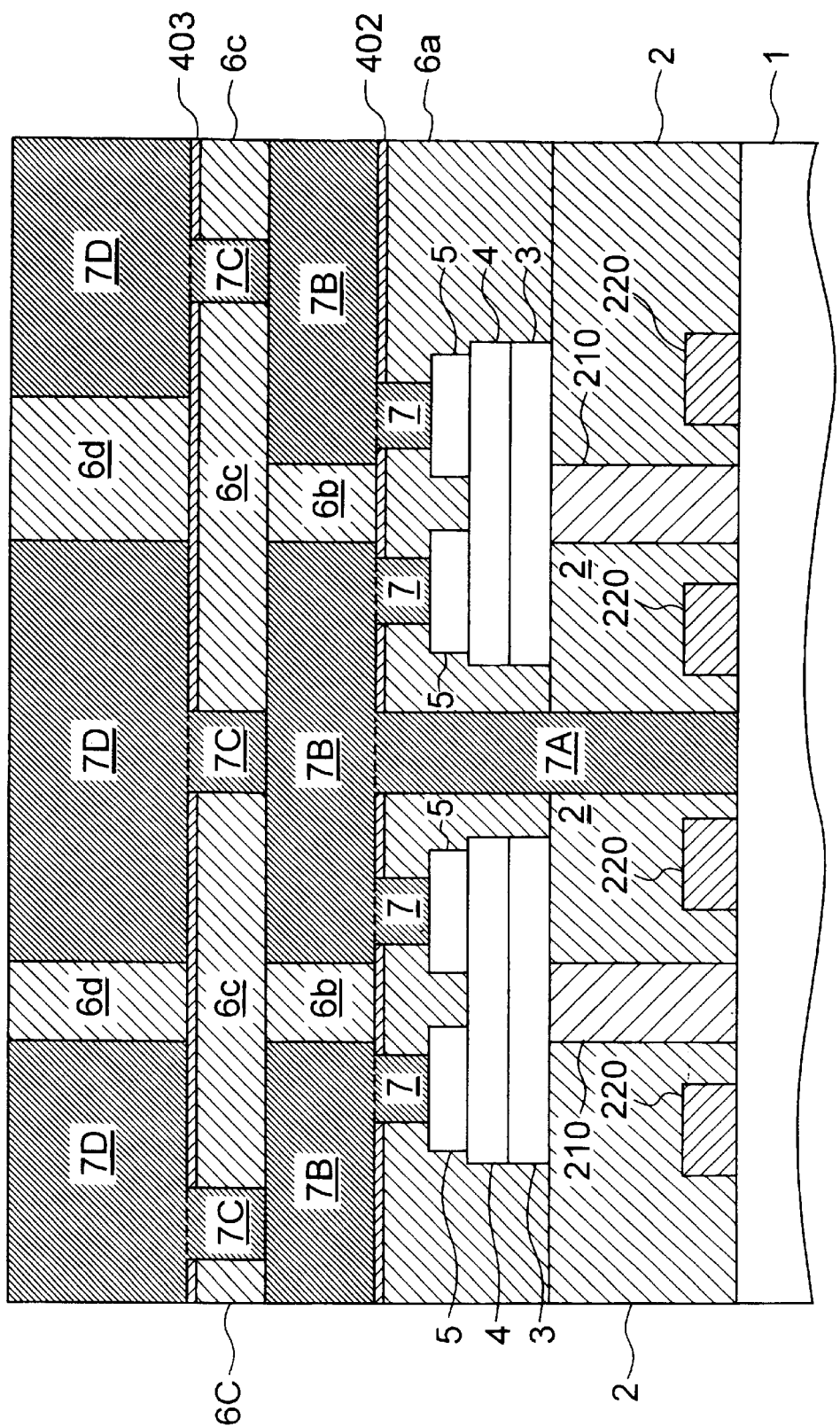
FIG. 23D is a cross-sectional view schematically showing a specific example in which ferroelectric random access memory similar to that shown in FIG. 20B is made by using capacitors shown in FIG. 23B.

FIG. 23D is a cross-sectional view schematically showing a specific example in which ferroelectric random access memory similar to that shown in FIG. 20B is made by using capacitors shown in FIG. 23B. In FIG. 23D, the same elements as those of FIGS. 20B and 23B are labeled with common reference numerals, and their detailed explanation is omitted. Ferroelectric random access memory shown in FIG. 23D also has the structure in which cells each including transistors 220 and a capacitor connected in parallel are connected in series as shown in FIG. 20C.

FIGS. 23E through 23K are cross-sectional views showing a major part of a manufacturing process of ferroelectric random access memory shown in FIG. 23D. Outline of the manufacturing process is as explained below.

Figure 23E:
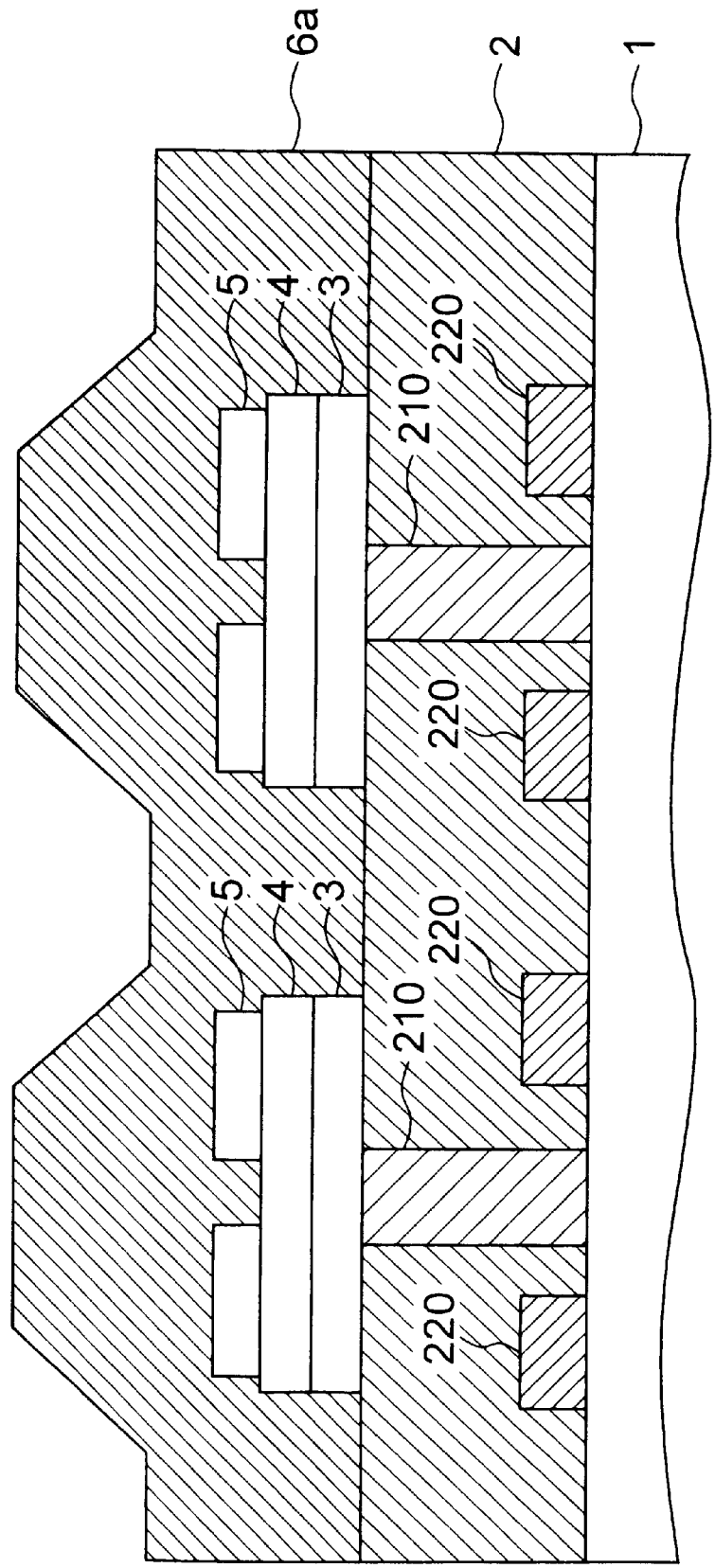
FIGS. 23E through 23K are cross-sectional views showing a major part of a manufacturing process of ferroelectric random access memory shown in FIG. 23D.

First as shown in FIG. 23E, transistors 220 are made on the silicon substrate 1, and buried with an inter-layer insulating film 2. Further, contact holes are made and buried with polysilicon or tungsten (W) to make plug electrodes 210. Then, lower electrodes 3, ferroelectric films 4 and upper electrodes 5 are made and patterned, and buried with an inter-layer insulating film 6a.

Figure 23F:
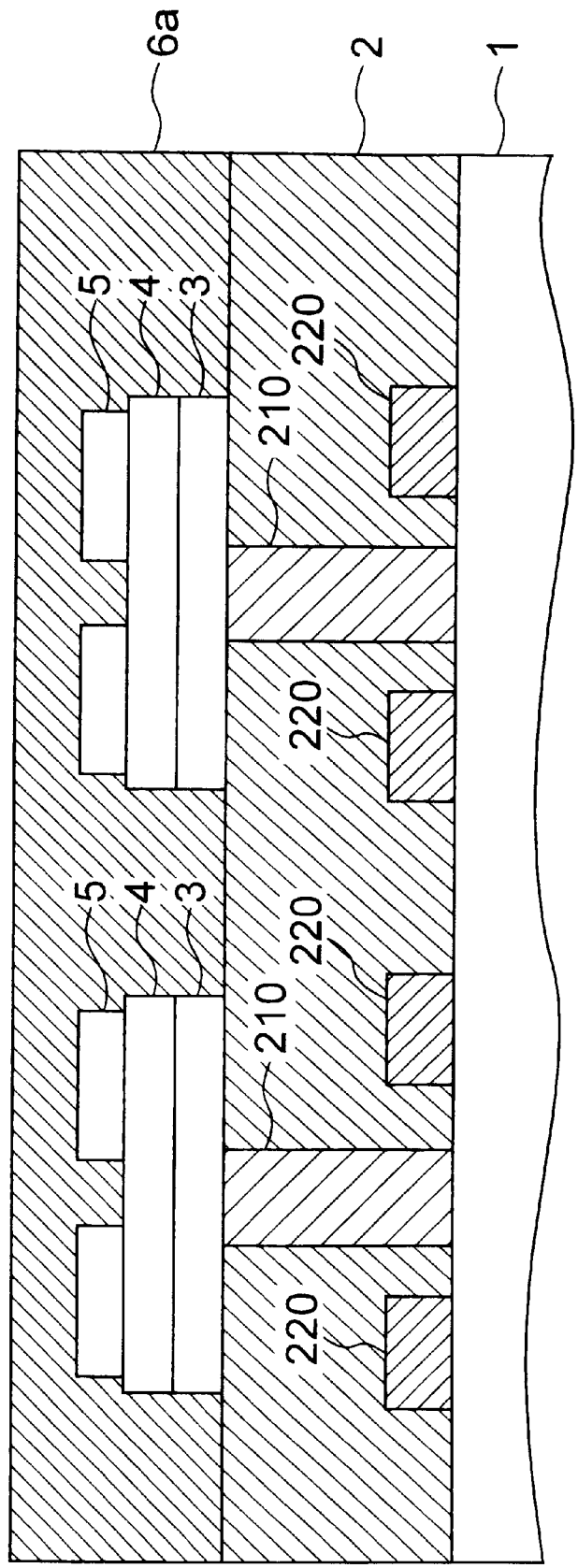

Next as shown in FIG. 23F, the inter-layer insulating film 6a is leveled.

Figure 23G:
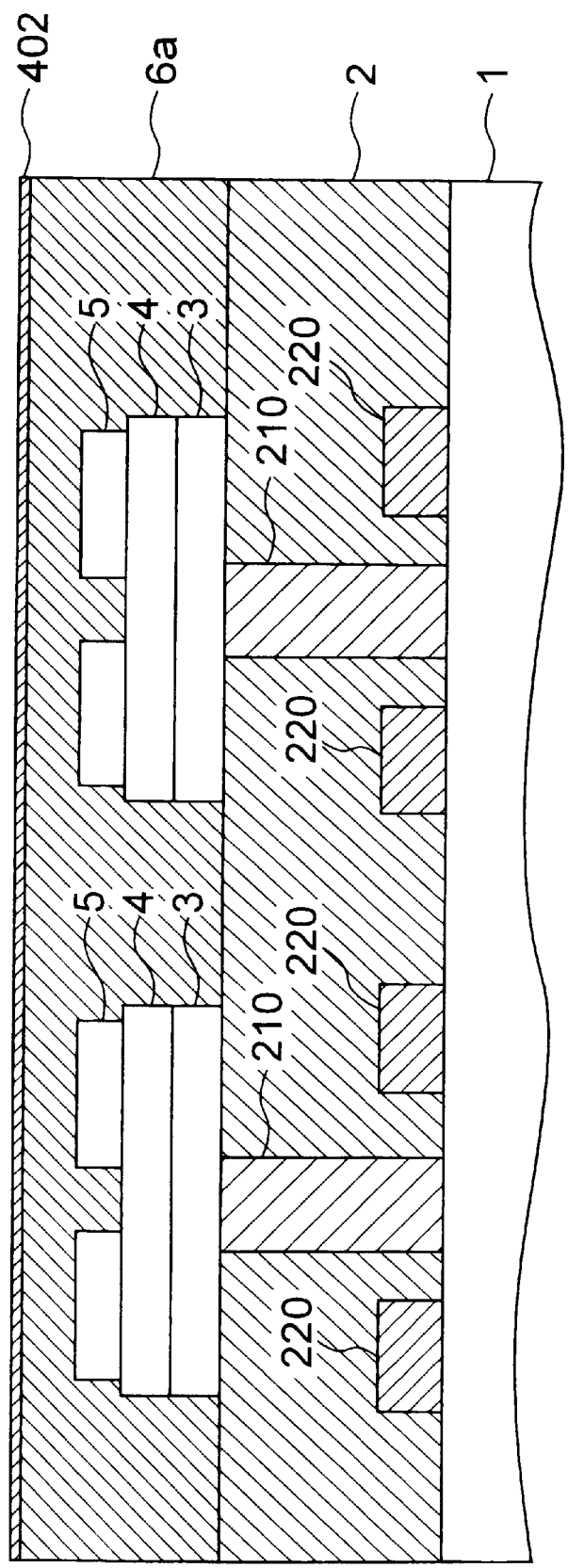
Figure 23H:
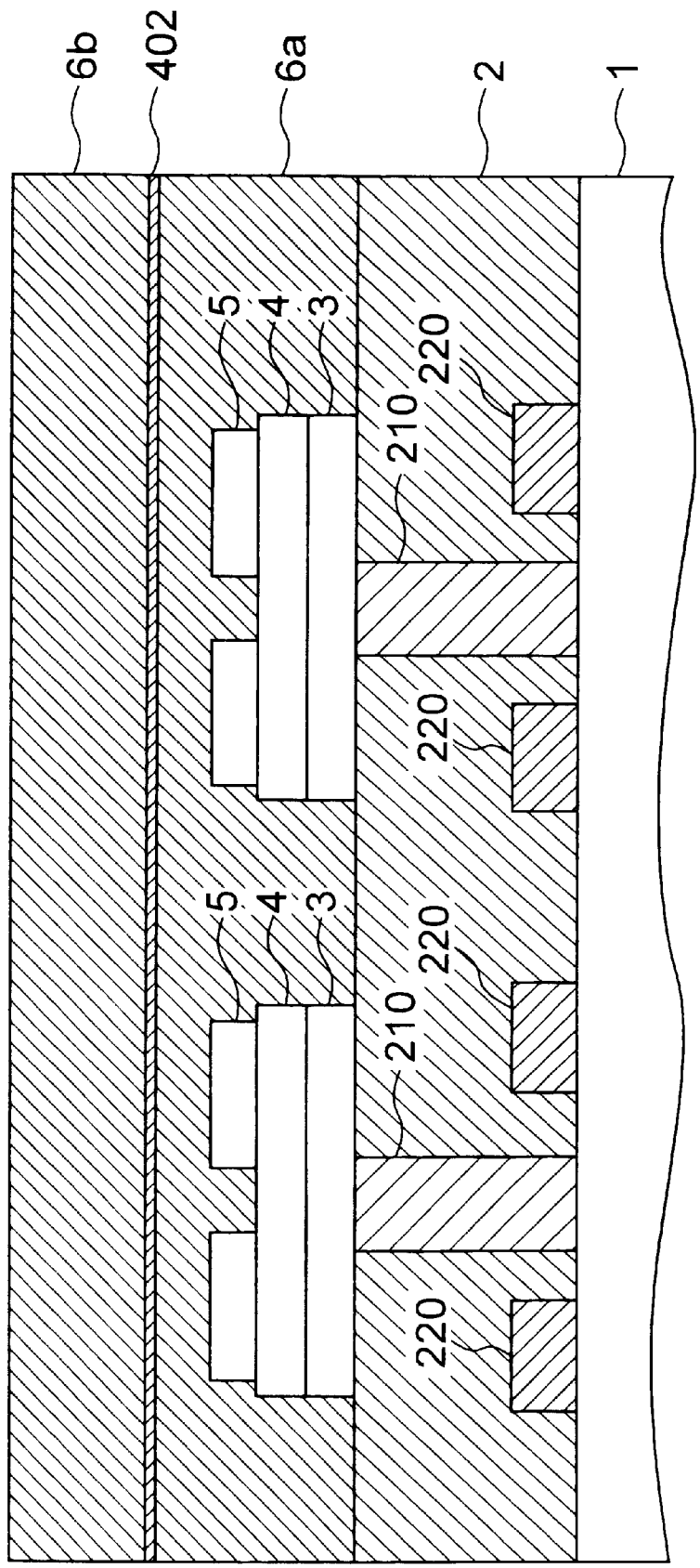

Next as shown in FIG. 23G, a hydrogen barrier film 402 is formed, and an inter-layer insulating film 6b is stacked as shown in FIG. 23H.

Figure 23I:
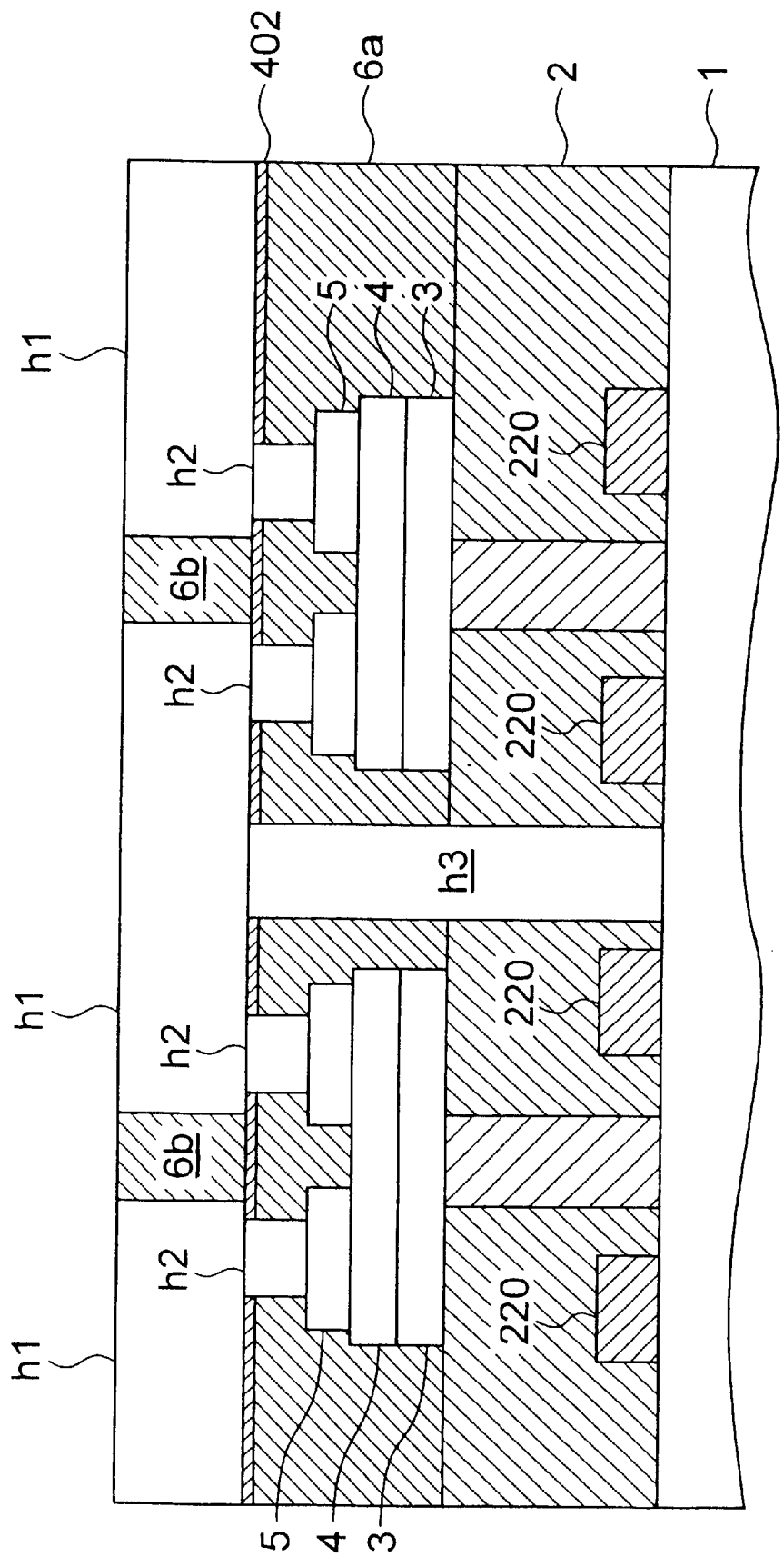

Next as shown in FIG. 23I, wiring grooves h1 are made through the inter-layer insulating film 6b. In this process, the hydrogen barrier film 402 serves as an etchingstopper. That is, the hydrogen barrier film 402 reliably stops etching of the inter-layer insulating film 6b, and over-etching is prevented easily and reliably. Next, contact holes h2 accessing from the bottom of the wiring grooves h1 to the upper electrodes 5 and contact holes h3 accessing to the silicon substrate 1 are made.

Figure 23J:
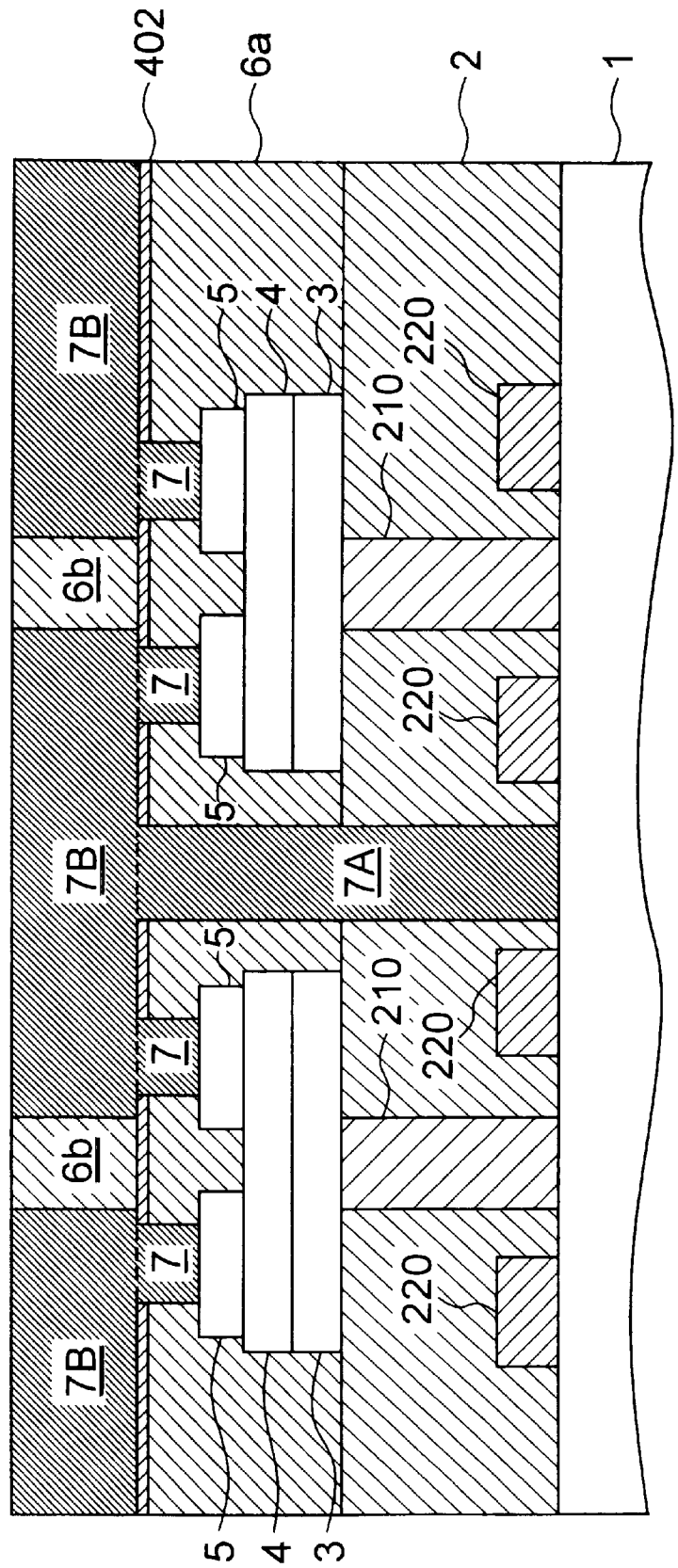

Then, as shown in FIG. 23J, aluminum is deposited by sputtering and reflowed to bury the contact holes h2, h3 and h1, then flatten the surface thereof by an appropriate technique such as CMP in order to form wiring layers 7, 7A and 7B.

Figure 23K:
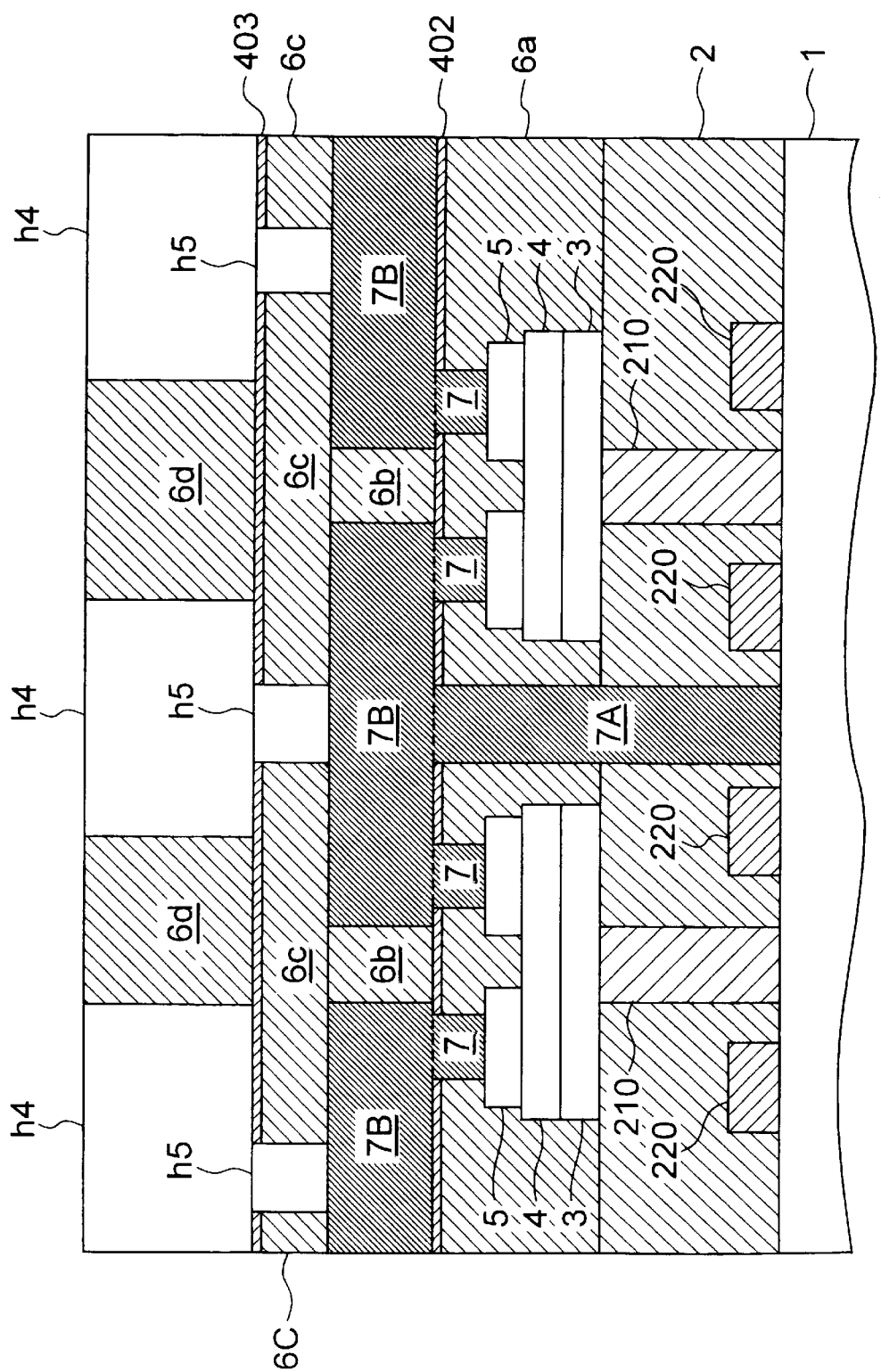

Finally, as shown in FIG. 23K, the inter-layer insulating film 6c, hydrogen barrier film 403, inter-layer insulating film 6d are stacked. Then, wiring grooves h4 are made through the inter-layer insulating film 6d. In this process, the hydrogen barrier film 403 serves as an etching stopper. That is, the hydrogen barrier film 403 reliably stops etching of the inter-layer insulating film 6d, and over-etching is prevented easily and reliably. Next, contact holes h5 are made through the bottom of the wiring grooves h4.

Then, by depositing aluminum by sputtering, reflowing it and then flattening the surface thereof, the aluminum wiring layers 7C and 7D are formed as shown in FIG. 23D.

As explained above, according to this example, the hydrogen barrier films 402 and 403 also function as etching stoppers when the wiring grooves h1 and h4 are made by etching, respectively. As a result, depths of the wiring grooves h1 and h4 can be controlled easily and reliably, and thicknesses of the wiring layers 7B and 7D can be controlled reliably.

(Sixth Embodiment)

Figure 24:
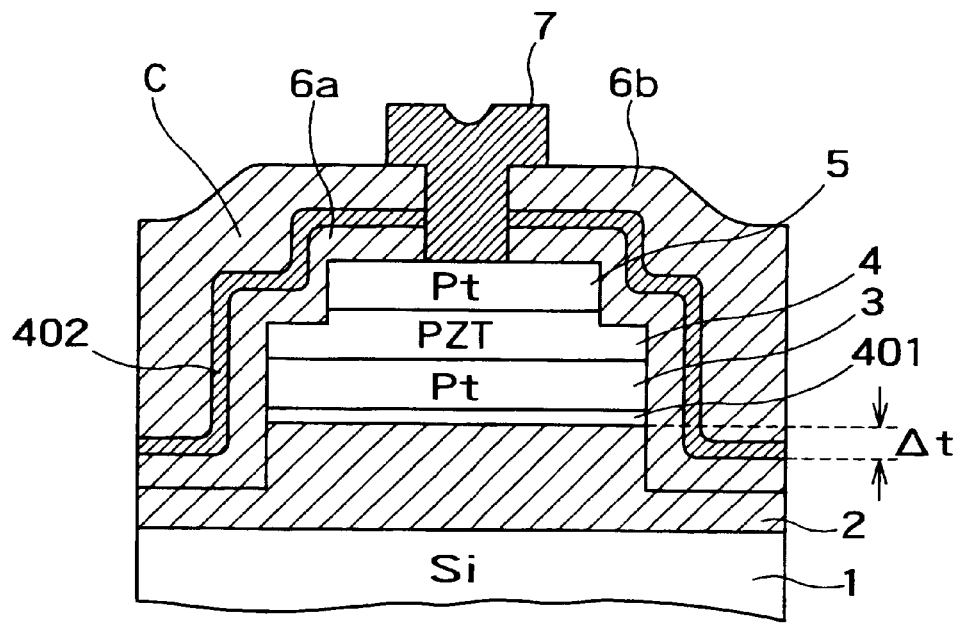
FIG. 24 is a diagram showing a manufacturing process of the ferroelectric capacitor of ferroelectric random access memory according to the sixth embodiment of the invention.

FIG. 24 shows an embodiment modified from the structure obtained by the fourth embodiment. In this embodiment, the bottom of the hydrogen barrier film 402 inserted between the inter-layer insulating films 6a and 6b is deeper by Δt than the bottom of the lower Pt electrode 3 of the ferroelectric capacitor C. By using this configuration, the diffusion path of hydrogen gas supplied to the region of the ferroelectric capacitor C through the inter-layer insulating film under the hydrogen barrier film 402 can be narrowed, and more effective prevention of hydrogen diffusion is attained. Further, the same effects as those of the fifth embodiment can be obtained as well.

Figure 25:
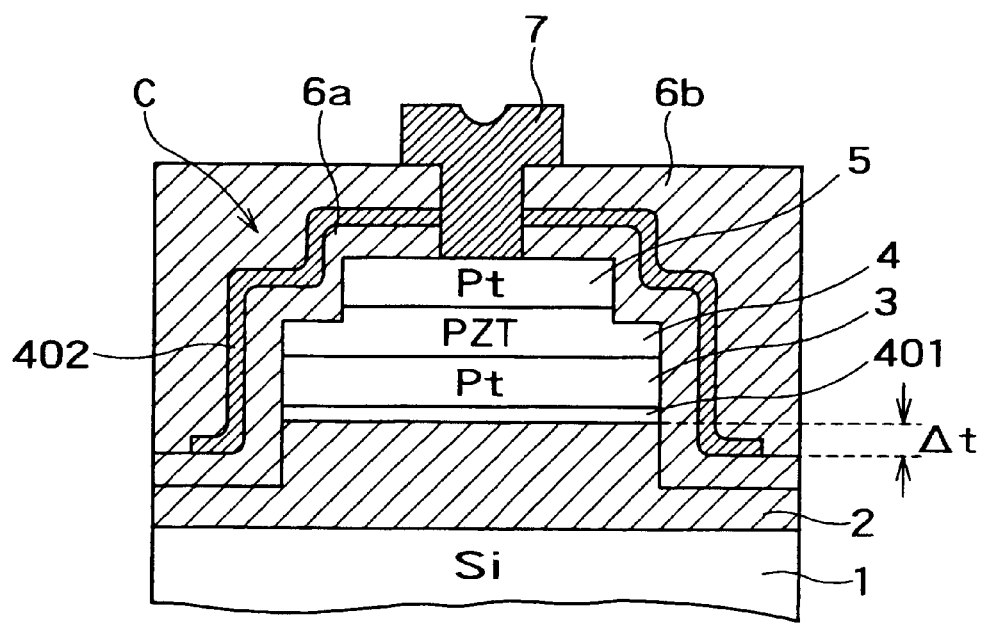
FIG. 25 is a diagram showing a structure modified from the structure of the same embodiment.

FIG. 25 shows a structure based on the structure of FIG. 24 and patterning the hydrogen barrier film 402 into a predetermined area enough to cover the region of the ferroelectric capacitor. By locating the hydrogen barrier film 402lower than the bottom of the lower Pt electrode 3 around the capacitor, a higher effect of preventing diffusion of hydrogen is already ensured. Therefore, even by selectively making the hydrogen barrier film 402 instead of making it to extend over the entire area of the inter-layer insulating film, a sufficient effect of hydrogen diffusion prevention is expected. Additionally, in FIG. 25, the inter-layer insulating film 6b is leveled.

Figure 26A:
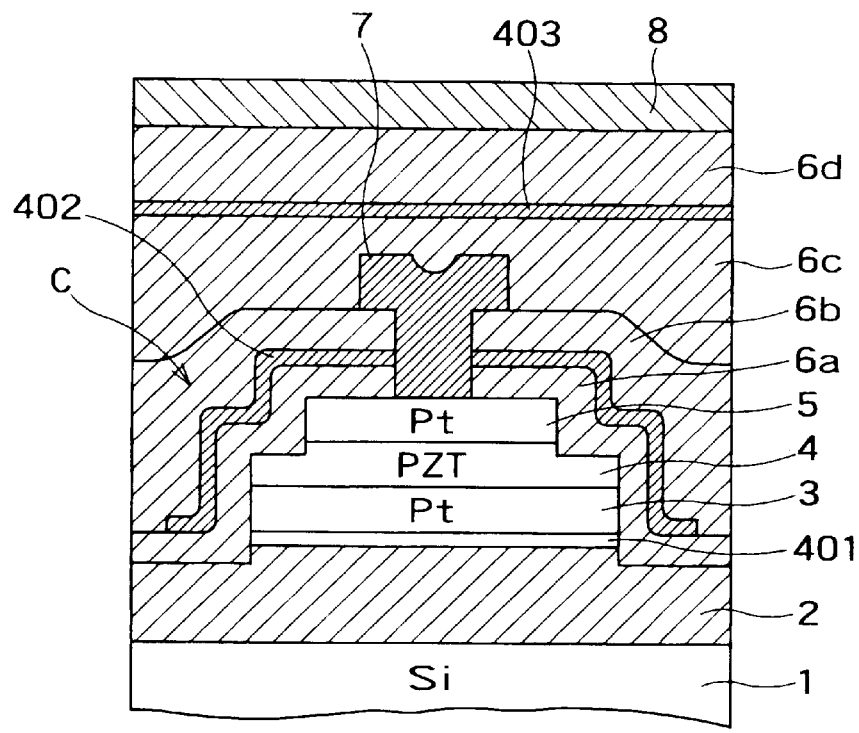
FIG. 26A is a diagram showing a structure modified from the structure of the embodiment shown in FIG. 21.

FIG. 26A is a structure based on the structure of FIG. 21 and patterning the hydrogen barrier film 402 into a predetermined area enough to cover the region of the ferroelectric capacitor.

Figure 26B:
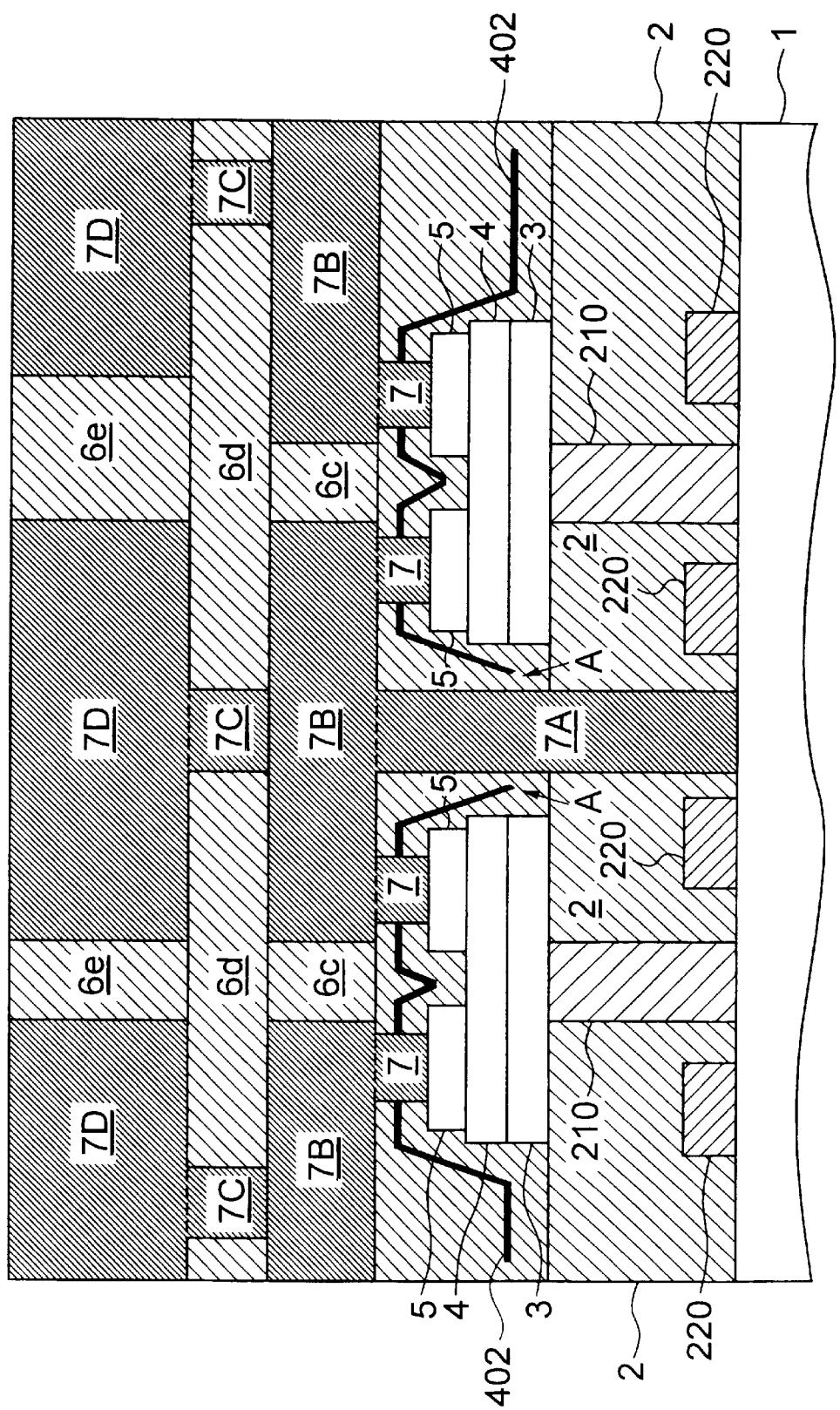
FIG. 26B is a cross-sectional view schematically showing a specific example of a ferroelectric random access memory similar to that shown in FIGS. 20B and 23D, in which capacitors having patterned hydrogen barrier film 402 are provided.

FIG. 26B is a cross-sectional view schematically showing a specific example of a ferroelectric random access memory similar to that shown in FIGS. 20B and 23D, in which capacitors having patterned hydrogen barrier film 402 are provided. In FIG. 26B, the same elements as those of FIGS. 20B, 23D and 26A are labeled with common reference numerals, and their detailed explanation is omitted.

Ferroelectric random access memory shown in FIG. 26B also has the structure in which cells each including transistors 220 and a capacitor connected in parallel are connected in series as shown in FIG. 20C.

In the example shown in FIG. 26B, the hydrogen barrier film 402 is removed partly near the wiring 7A as shown by arrow A in the figure and has openings. By providing such openings through the hydrogen barrier film 402, it becomes easier to form the contact holes (corresponding to contact hole h3 shown in FIG. 23I) to form the wiring 7A. That is, when making the contact hole h3, it becomes unnecessary to etch through the hydrogen barrier film 402.

Additionally, by making openings through the hydrogen barrier film 402, the hydrogen annealing of the transistor 220 can be effectively performed. That is, it is preferable to conduct an annealing in a hydrogen atmosphere in order to realize a good characteristics of the transistor 220. However, an effective annealing effect may not be obtained if the hydrogen barrier film 402 fully covers the transistor 220 and prevents the hydrogen diffusion to the transistor 220. In contrast to this, by providing openings through the hydrogen barrier film 402 as shown in FIG. 26B, hydrogen can easily reach the transistor 220, thus the hydrogen annealing effect can be effectively obtained.

Also when the titanium compound film 501 as shown in FIG. 23C is provided similarly in the structure shown in FIG. 26B, the same effects are obtained. That is, in the structure shown in FIG. 26B, by making the titanium compound film (not shown) between the upper electrode 5 and the wiring 7, "exfoliation" of the inter-layer insulating film 6a from the upper electrode 5 and alloying interaction between the upper electrode 5 and the aluminum wiring 7 can be prevented effectively. Therefore, this structure is especially advantageous in ferroelectric random access memory using an aluminum reflow wiring.

Figure 27:
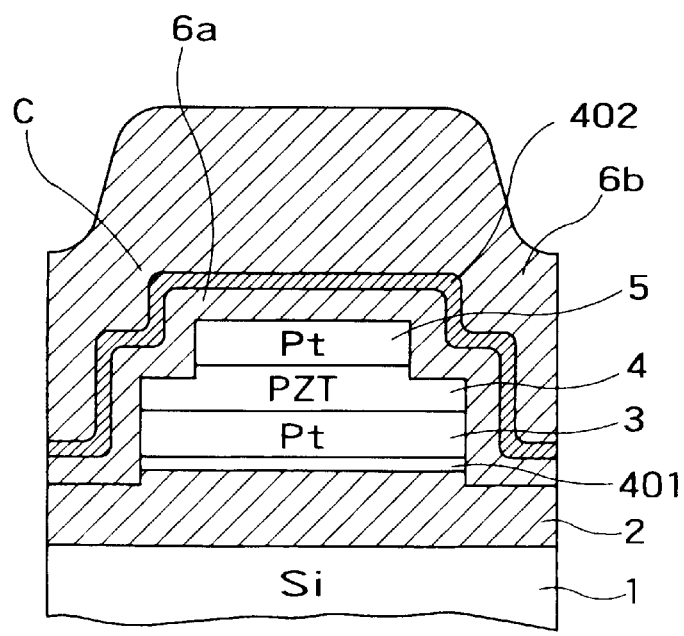
FIG. 27 is a diagram showing a manufacturing process of a ferroelectric capacitor of ferroelectric random access memory according to the fourth embodiment of the invention.
Figure 28:
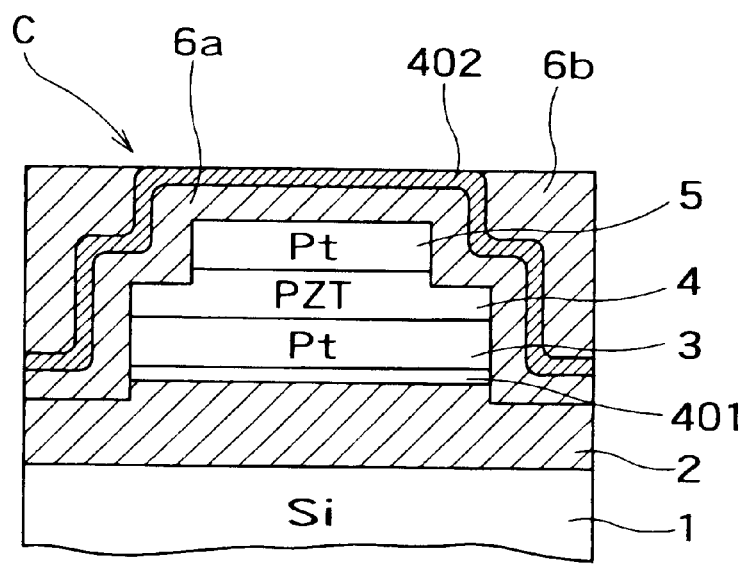
FIG. 28 is a diagram showing a manufacturing process of the ferroelectric capacitor of ferroelectric random access memory according to the fourth embodiment of the invention.
Figure 29:
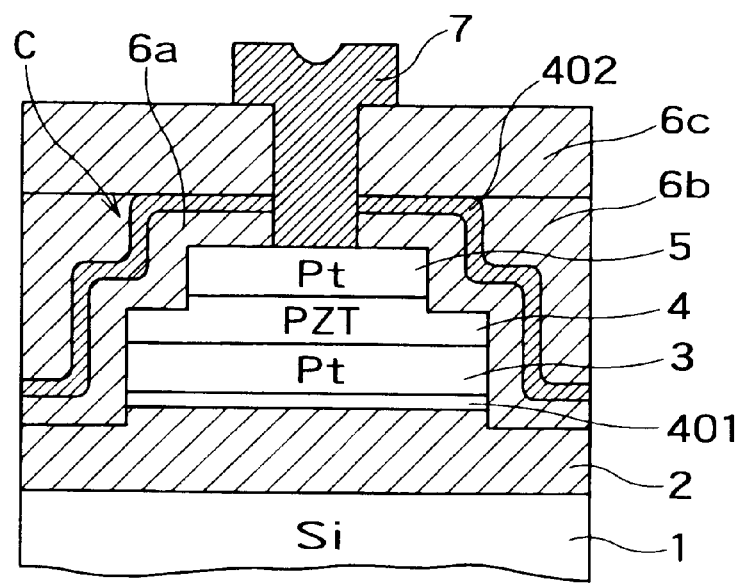
FIG. 29 is a diagram showing a manufacturing process of the ferroelectric capacitor of ferroelectric random access memory according to the fourth embodiment of the invention.

FIGS. 27 through 29 show an embodiment modified from the structure obtained by the fourth embodiment. In this embodiment, the hydrogen barrier film 402 is used as a stopper film in a process for leveling the inter-layer insulating film 6b by CMP. After the inter-layer insulating film 6a is stacked as shown in FIG. 18, the hydrogen barrier film 402 is stacked on the inter-layer insulating film 6a as shown in FIG. 27, and the inter-layer insulating film 6b is further stacked. In case of this embodiment, films are stacked such that the thickness of the inter-layer insulating film is approximately 0.15 times of the thickness of the ferroelectric capacitor C. Then as shown in FIG. 28, by using the hydrogen barrier film 402 as a stopper film in the CMP process, the inter-layer insulating film 6b is smoothed. Further, as shown in FIG. 29, the inter-layer insulating film 6c is formed on the inter-layer insulating film 6b. Finally, a contact hole is made, and the terminal wiring 7 for connection to the upper Pt electrode 5 is made.

In this embodiment, the hydrogen barrier film 402 is a film having a hydrogen diffusion constant not higher than $10^{-5}$ cm$^2$/s. An aluminum oxide (Al$_2$O$_3$) film is representative one of such films. Otherwise, the same effect is obtained by using an Al$_x$O$_y$ film, Al$_x$Si$_y$O$_z$ film, Ti$_x$O$_y$ film, Mg$_x$O$_y$ film, Zr$_x$O$_y$ film, their combination, or complex metal oxide containing at least one of those elements.

According to this embodiment the inter-layer insulating film between the capacitor C and the terminal wiring 7 can be made to any desired thickness. Further, by inserting the hydrogen barrier film inside the inter-layer insulating film, the ferroelectric capacitor is prevented from deterioration of the performance. Furthermore, the same effects as those of the fourth embodiment are obtained as well.

It is also possible to use this embodiment in combination with the embodiment shown in FIG. 22 and FIG. 25. That is, after the inter-layer insulating film 6b is smoothed by using the hydrogen barrier film 402 shown in FIGS. 22 and 25 as a stopper film, the inter-layer insulating film 6c is formed thereon to adjust the inter-layer insulating film between the capacitor C and the terminal wiring 7 to a desired thickness. Additionally, needless to say, this embodiment can be used when the inter-layer insulating film 6 of FIG. 16 is stacked to a desired thickness. The hydrogen barrier film 303 in FIG. 16 is used as a stopper. It is also possible to combine this embodiment with other embodiments.

Figure 30:
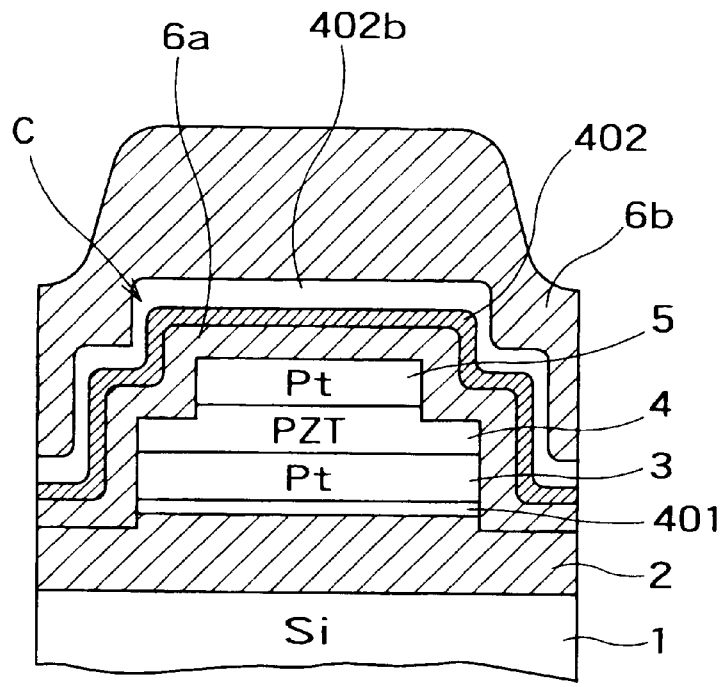
FIG. 30 is a diagram showing a manufacturing process of the ferroelectric capacitor of ferroelectric random access memory according to the fourth embodiment of the invention.
Figure 31:
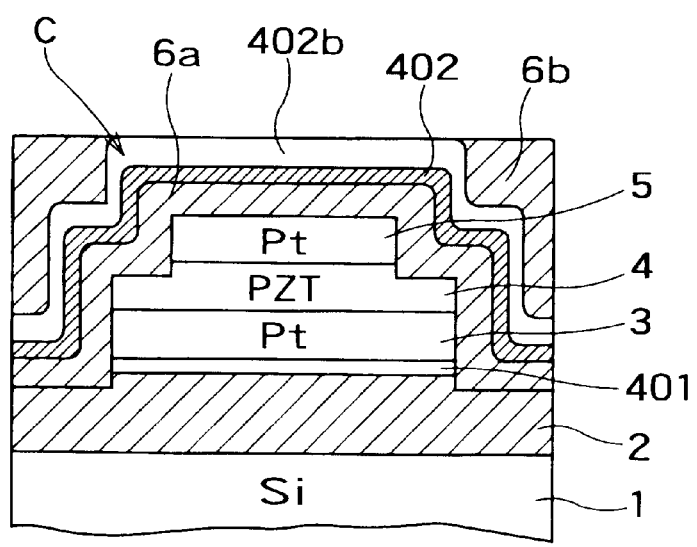
FIG. 31 is a diagram showing a manufacturing process of a ferroelectric capacitor of ferroelectric random access memory according to the fourth embodiment of the invention.
Figure 32:
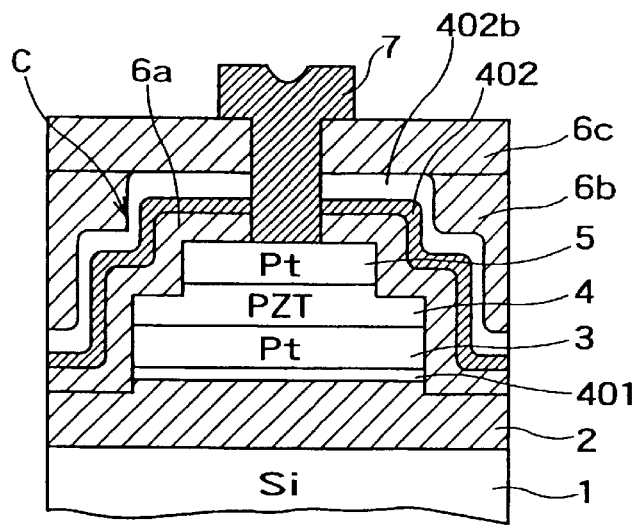
FIG. 32 is a diagram showing a manufacturing process of a ferroelectric capacitor of ferroelectric random access memory according to the fourth embodiment of the invention.

If the hydrogen barrier film 402 is insufficient as a stopper film, a stopper film 402b of Si$_x$N$_y$ (or Si$_x$N$_y$O$_z$), approximately 100 Å thick, may be formed on the hydrogen barrier film 402 as shown in FIG. 30. In this case, as shown in FIG. 31, the stopper film 402b is used to level the inter-layer insulating film 6b. Further, as shown in FIG. 32, the inter-layer insulating film 6c is formed on the inter-layer insulating film 6b. Finally, a contact hole is made, and the terminal wiring 7 is formed for connection to the upper Pt electrode 5. The stopper Si$_x$N$_y$ (or Si$_x$N$_y$O$_z$) film on the hydrogen barrier film is usable in the same manner also in FIGS. 11, 16, 22 and 25.

(Seventh Embodiment)

Figure 33:
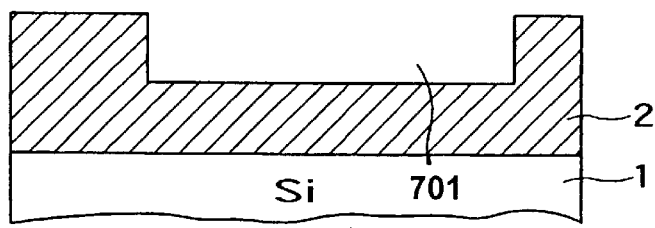
FIG. 33 is a diagram showing a manufacturing process of a ferroelectric capacitor of ferroelectric random access memory according to the seventh embodiment of the invention.
Figure 34:
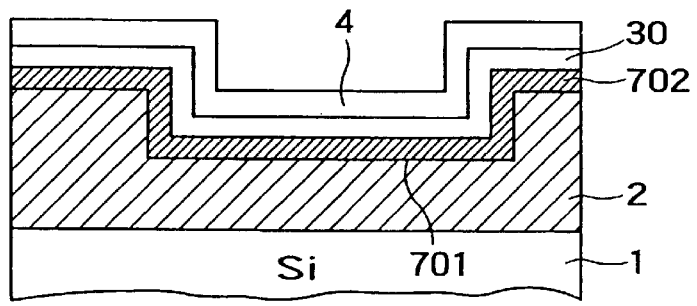
FIG. 34 is a diagram showing a manufacturing process of the ferroelectric capacitor of ferroelectric random access memory according to the fourth embodiment of the invention.

FIGS. 33 through 36 show a manufacturing process of a ferroelectric capacitor of ferroelectric random access memory according to the seventh embodiment of the invention. As shown in FIG. 33, after a transistor (not shown) is made on the silicon substrate 1, its surface is covered by an inter-layer insulating film 2 of silicon oxide, for example, to level it. In the region for making the ferroelectric capacitor above the inter-layer insulating film 2, a groove 701 is made. Then, as shown in FIG. 34, a hydrogen barrier film 702 is stacked to 20 nm, and the lower Pt electrode film 30, about 100 nm thick, and the PZT film 4, about 150 nm thick, are stacked. Thereafter, the PZT film 4 is crystallized by RTA (rapid thermal annealing) in an oxygen atmosphere of 650° C.

Figure 35:
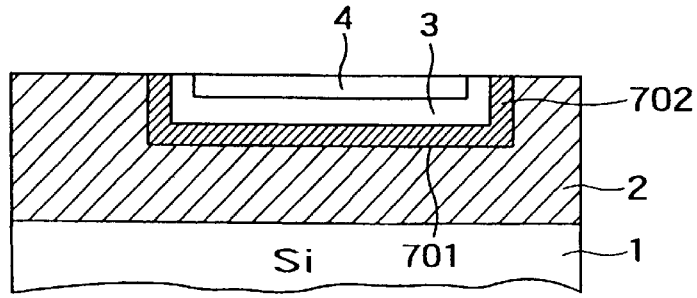
FIG. 35 is a diagram showing a manufacturing process of the ferroelectric capacitor of ferroelectric random access memory according to the fourth embodiment of the invention.
Figure 36:
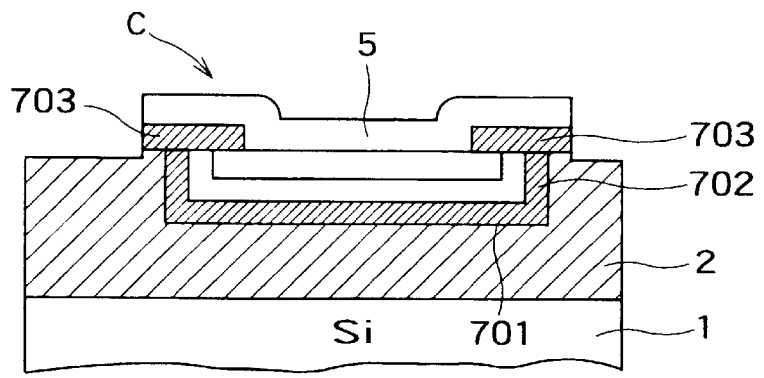
FIG. 36 is a diagram showing a manufacturing process of the ferroelectric capacitor of ferroelectric random access memory according to the fourth embodiment of the invention.

Subsequently, as shown in FIG. 35, CMP is conducted to remove the hydrogen barrier film 702 from outside the groove 701 and smooth the surface so as to configure the PZT film 4 as being buried in the groove 701. Then as shown in FIG. 36, a hydrogen barrier film 703 is stacked on the PZT film 4, and after an aperture for the upper electrode is made, the upper Pt electrode 5 is made by patterning. The hydrogen barrier film 703 is patterned together with the upper Pt electrode 5. In this manner, the ferroelectric capacitor C is obtained.

After that, although not shown, an inter-layer insulating film is stacked, a contact hole is made, and the terminal wiring is formed.

In this embodiment, metal oxide films having a hydrogen diffusion constant not higher than $10^{-5}$ cm$^2$/s are desirable as the hydrogen barrier films 702, 703, and aluminum oxide (Al$_2$O$_3$) is typically used. SrRuO$_3$, Zr$_x$O$_y$, Ru$_x$O$_y$, Sr$_x$O$_y$ and Mg$_x$O$_y$ are also usable, in addition to Al$_2$O$_3$, as the material of the barrier film 702. As for the upper hydrogen barrier film 703, since the use of a low resistive material may cause the short-circuiting the upper and lower electrodes, a film having a relatively higher resistance, such as AlO$_x$, Zr$_x$O$_y$, and Mg$_x$O$_y$ may preferably be used.

According to this embodiment, hydrogen diffusion especially to the lower Pt electrode 3 is effectively inhibited, and an excellent ferroelectric capacitor property is obtained. Further, diffusion of Ti into the PZT film and outward diffusion of Pb from the PZT film do not occur, and an excellent property is obtained. Furthermore, the hydrogen barrier film 702, lower electrode 3 and PZT film 4 can be made in the groove in self alignment. Additionally, the hydrogen barrier film 702, lower electrode film 30 and PZT film 4 are processed by CMP instead of etching. Therefore, without steps on side surface of the hydrogen barrier film 702, lower electrode 30, etc., a reliable ferroelectric capacitor is obtained.

Furthermore, by interposing a inter-layer insulating film (not shown) between the barrier films 702, 703 and the capacitor, the same effect as explained for the fourth embodiment is equally obtained in this seventh embodiment.

(Eighth Embodiment)

Figure 37:
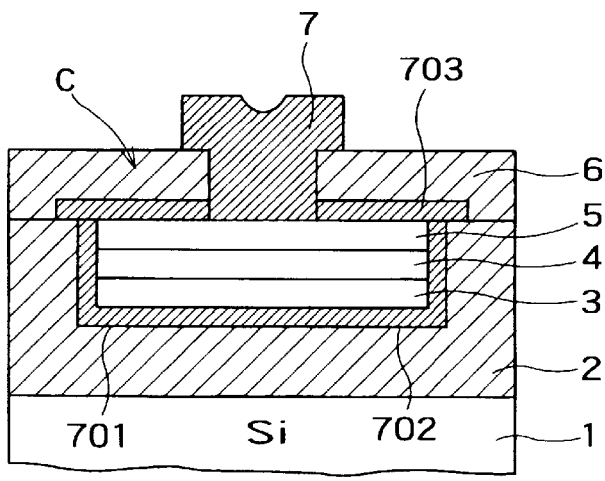
FIG. 37 is a diagram showing the structure of a ferroelectric capacitor of ferroelectric random access memory according to the eighth embodiment of the invention.

FIG. 37 shows an embodiment modified from the structure according to the seventh embodiment. In this embodiment, after the hydrogen barrier film 702 is formed on the bottom surface and side surfaces of the groove 701 formed in the inter-layer insulating film 2, the lower Pt electrode 3, PZT film 4 and upper Pt electrode 5 are sequentially buried in the groove 701. Then, the region of the capacitor C is covered with a hydrogen barrier film 703, and after the inter-layer insulating film 6 is stacked, a contact hole is made, and the terminal wiring 7 is formed.

According to this embodiment, diffusion of hydrogen into the PZT film is more effectively prohibited, and an excellent ferroelectric capacitor property is obtained. Further, diffusion of Ti into the PZT film and outward diffusion of Pb from the PZT film do not occur, and an excellent property is obtained. Furthermore, the entirety of the ferroelectric capacitor is formed inside the groove 701 in self alignment.

(Ninth Embodiment)

Figure 38:
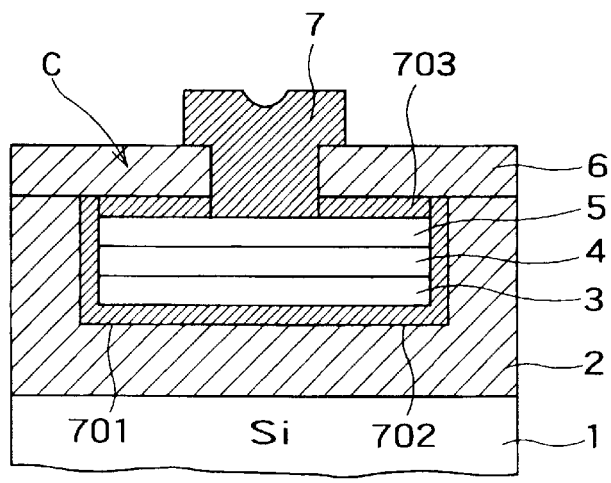
FIG. 38 is a diagram showing the structure of a ferroelectric capacitor of ferroelectric random access memory according to the ninth embodiment of the invention.

FIG. 38 shows an embodiment further progressing the eighth embodiment to bury the portion up to the upper hydrogen barrier layer 703 in the groove 701. According to these embodiments, configuration results in covering the entirety of the ferroelectric capacitor with the hydrogen barrier film, and adverse affection by hydrogen diffusion can be reduced more effectively. Further, diffusion of Ti into the PZT film and outward diffusion of Pb from the PZT film do not occur, and an excellent property is obtained. Furthermore, the entirety of the ferroelectric capacitor is formed inside the groove 701 in self alignment.

(Tenth Embodiment)

Figure 39:
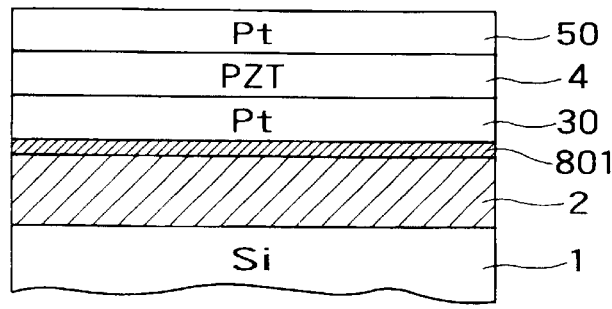
FIG. 39 is a diagram showing a manufacturing process of a ferroelectric capacitor of ferroelectric random access memory according to the tenth embodiment of the invention.

FIGS. 39 through 41 and 42 to 43 show a manufacturing process of a ferroelectric capacitor of ferroelectric random access memory according to the tenth embodiment of the invention, which is configured to automatically make a hydrogen barrier film also on side surfaces of the PZT film in the manufacturing process of the embodiment forming the hydrogen barrier film under the lower Pt electrode. As shown in FIG. 39, after a inter-layer insulating film 2 is formed on the silicon substrate already having formed a transistor, the lower Pt electrode film 30, PZT film and upper electrode film 50 are sequentially stacked thereon via a hydrogen barrier film 801. Processing the PZT film 4 by annealing for crystallization is the same as the preceding embodiments. As the hydrogen barrier film 801, metal oxide films having a hydrogen diffusion constant not higher than $10^{-5}$ cm$^2$/s are desirable, and aluminum oxide (Al$_2$O$_3$) is typically used. In case of this embodiment, at least one of SrRuO$_3$, Zr$_x$O$_y$, Ru$_x$O$_y$, Sr$_x$O$_y$ and Mg$_x$O$_y$ is used, in addition to Al$_2$O$_3$.

Figure 40:
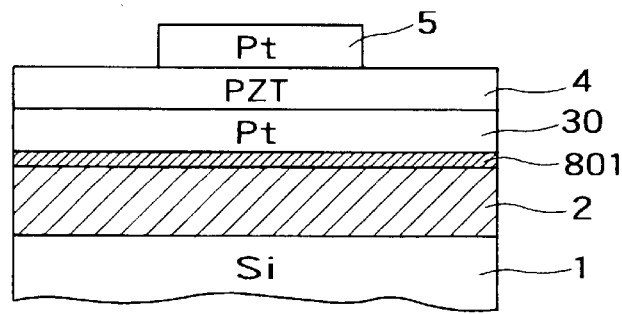
FIG. 40 is a diagram showing a manufacturing process of the ferroelectric capacitor of ferroelectric random access memory according to the tenth embodiment of the invention.
Figure 41:
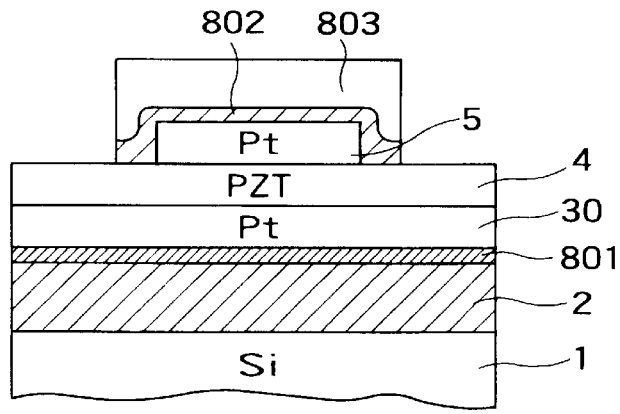
FIG. 41 is a diagram showing a manufacturing process of the ferroelectric capacitor of ferroelectric random access memory according to the tenth embodiment of the invention.
Figure 42:
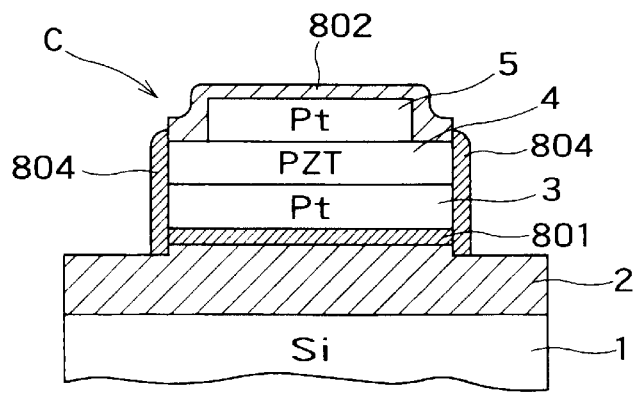
FIG. 42 is a diagram showing a manufacturing process of the ferroelectric capacitor according to the same embodiment.

After that, as shown in FIG. 40, the upper Pt electrode 5 is patterned. Thereafter, as shown in FIG. 41, a SiO$_2$ film 802 is stacked and patterned to cover the upper Pt electrode 5 by using a resist pattern 803. Using the patterned SiO$_2$ film 802 as a mask, the PZT film 4, lower Pt electrode film 30 and hydrogen barrier film 801 are processed by dry etching such as RIE, for example, and the PZT film 4 and the lower Pt electrode 3 are patterned to have a wider area than the upper Pt electrode 5. As a result, the ferroelectric capacitor C is obtained as shown in FIG. 42.

In the dry etching step of the PZT film 4, lower Pt electrode film 3 and hydrogen barrier, film 801, there is used an etching condition which ensure that side surfaces of the PZT film 4 and the lower Pt electrode film 30 become near to vertical surfaces, more specifically, sharp slopes having an angle not lower than 75°. When this etching condition is used, a re-deposit film 804 is formed on side surfaces of the PZT film 4 and the lower Pt electrode 3 after processed as shown in FIG. 42. Although this re-deposit film 804 contains etched substances from the hydrogen barrier film 801, and from the PZT film 4, Pt films, SiO$_2$ films, etc., since it contains the substance of the hydrogen barrier film, it exhibits a certain hydrogen barrier effect.

Figure 43:
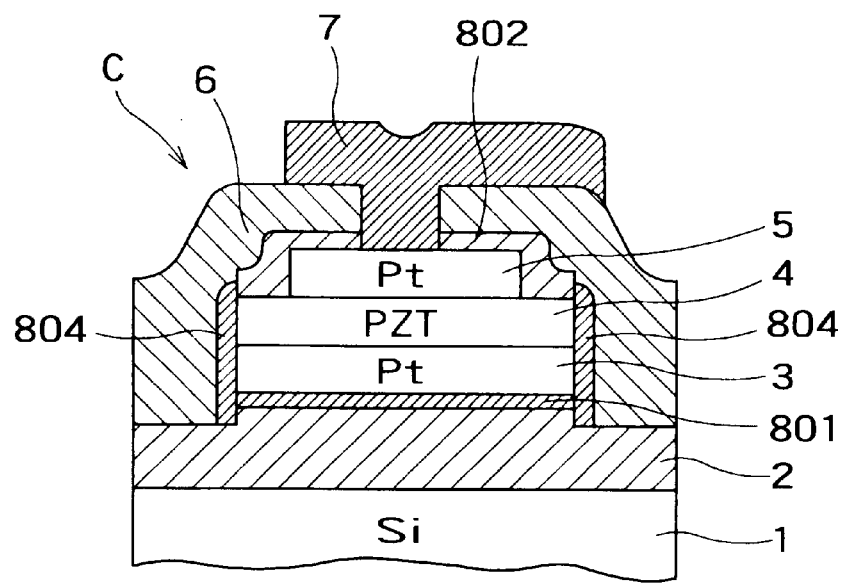
FIG. 43 is a diagram showing a manufacturing process of the ferroelectric capacitor according to the same embodiment.

After that, as shown in FIG. 43, the inter-layer insulating film 6 is stacked, a contact hole is made, and the terminal wiring 7 is formed.

According to this embodiment, it is possible to automatically make a protective film having a hydrogen barrier effect on side surfaces of the ferroelectric capacitor C. Without Ti diffusion to the PZT film and outward diffusion of Pb from the PZT film, an excellent property is obtained. Further, since the PZT film 4 and the lower electrode 3 are patterned to have a large area while covering the upper electrode 5 with an insulating film, short-circuit between the upper and lower electrodes is also prevented reliably.

(Eleventh Embodiment)

Figure 44:
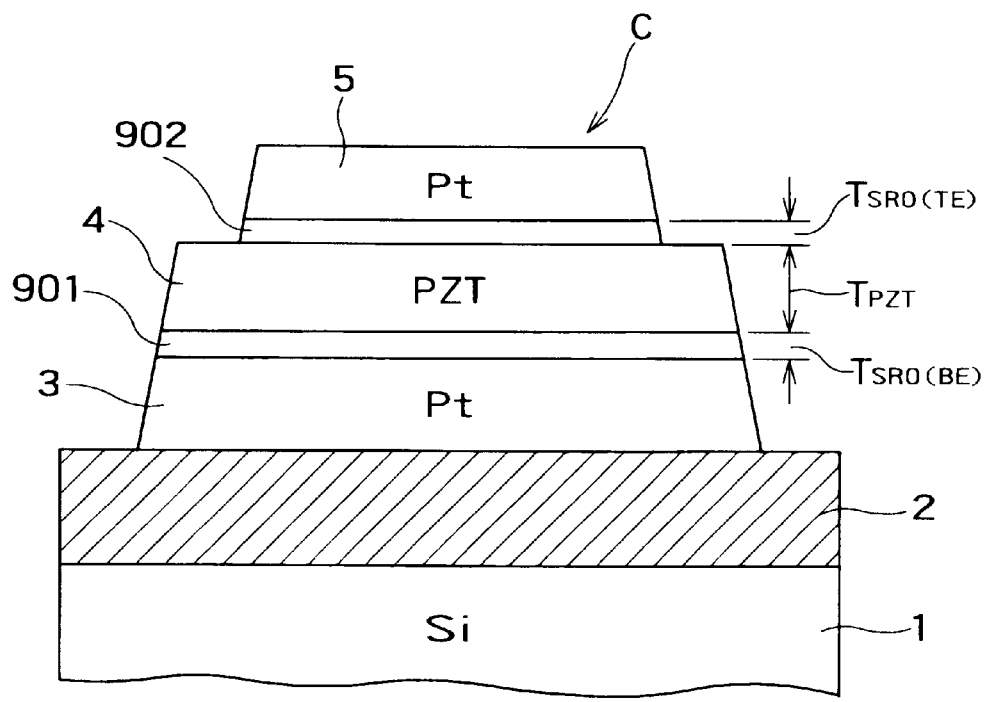
FIG. 44 is a diagram showing the structure of a ferroelectric capacitor of ferroelectric random access memory according to the eleventh embodiment of the invention.

FIG. 44 is shows a structure of a ferroelectric capacitor of ferroelectric random access memory according to the eleventh embodiment. In conventional ferroelectric capacitors having a Pt/PZT/Pt structure, the ferroelectric property is deteriorated due to hydrogen reducing interaction, etc. through steps for multi-layered wiring. More specifically, due to switching of spontaneous polarization over $10^5$ to $10^8$ times, the spontaneous polarization amount decreases largely. In this embodiment, as shown in FIG. 44, Sr$_x$Ru$_y$O$_z$ films (where composition ratios may be equal, respectively, and the films are hereinafter simply called SRO films) 901, 902 are interposed between the upper and lower electrodes 5, 3 and the PZT film 4, respectively, and their thicknesses are selected from a predetermined range relative to the thickness of the PZT film 4 to improve the fatigue characteristics.

For manufacturing it, the lower Pt electrode 3 and the SRO film 901 are stacked on the inter-layer insulating film 2 by sputtering, and annealed for crystallization. After that, the PZT film 4 is stacked by thick sputtering under the gas pressure of 2 to 4.5 Pa. Subsequently, the SRO film 902 is stacked, and the films are annealed for crystallization at that time. Further, the upper Pt electrode 5 is stacked by sputtering, and crystallization annealing is conducted again.

After that, a silicon oxide film as a cap material is stacked, and through steps of lithography and RIE, the upper Pt electrode is patterned. Subsequently, by further steps of lithography and RIE, the PZT film and the lower Pt electrode are patterned. At that time, recovery annealing is conducted at 650° C. Thereafter, although not shown, an inter-layer insulating film is stacked, a contact hole for the upper Pt electrode is made, recovery annealing of 650° C. is conducted again, and the wiring is made.

Actually, various test samples were made, taking the thickness T$_{pzt}$ (nm) of the PZT film 4, thicknesses T$_{sro}$(BE) (nm) and Tsro(TE) (nm) of the SRO films 901, 902, crystallizing temperature (° C.) of the PZT film 4, etc. as parameters, and their properties were evaluated. Table 1 below shows the conditions of the test samples and results of their evaluation. In each sample, $T_{sro}(BE)=T_{sro}(TE)$, and both are indicated below by $T_{sro}$. Note here, however, that the sample No. 12 has a SRO film only on the part of the lower electrode, and the sample No. 13 has no SRO film. Results of their evaluation include amounts of spontaneous polarization $Q_{SW}$ ($\mu C/cm^2$) and total evaluation (E means "excellent", G means "good", and P means "poor").

TABLE 1

| Sample No. | $T_{pzt}$ (nm) | $T_{sro}$ (nm) | Crystall. Temp. (° C.) | $Q_{SW}$ ($\mu C/cm^2$) | Total Evaluat. |
|---|---|---|---|---|---|
| 1 | 150 | 10 | 550 | 15.6 | E |
| 2 | 150 | 10 | 650 | 18.1 | E |
| 3 | 150 | 10 | 750 | large leak | P |
| 4 | 150 | 10 | 650 | 22 | E |
| 5 | 150 | 20 | 650 | 21.6 (with leak) | P |
| 6 | 150 | 10 | 650 | 22.7 | E |
| 7 | 150 | 5 | 650 | 17.6 | G |
| 8 | 150 | 2 | 650 | large leak | P |
| 9 | 120 | 10 | 650 | 16.2 | G |
| 10 | 90 | 10 | 650 | 17.8 (with leak) | P |
| 11 | 220 | 10 | 650 | 22.4 | E |
| 12 | 150 | 10 (lower) | 650 | 12.4 | P |
| 13 | 150 | — | 650 | 7.6 | P |

Regarding the leak characteristics, when the leak current responsive to application of d.c. 5V exceeds $10^{-4}$ A/cm$^2$, was evaluated as being bad "B". For total evaluation, ratios of spontaneous polarization characteristics were taken into consideration in addition to leak characteristics.

Figure 45:
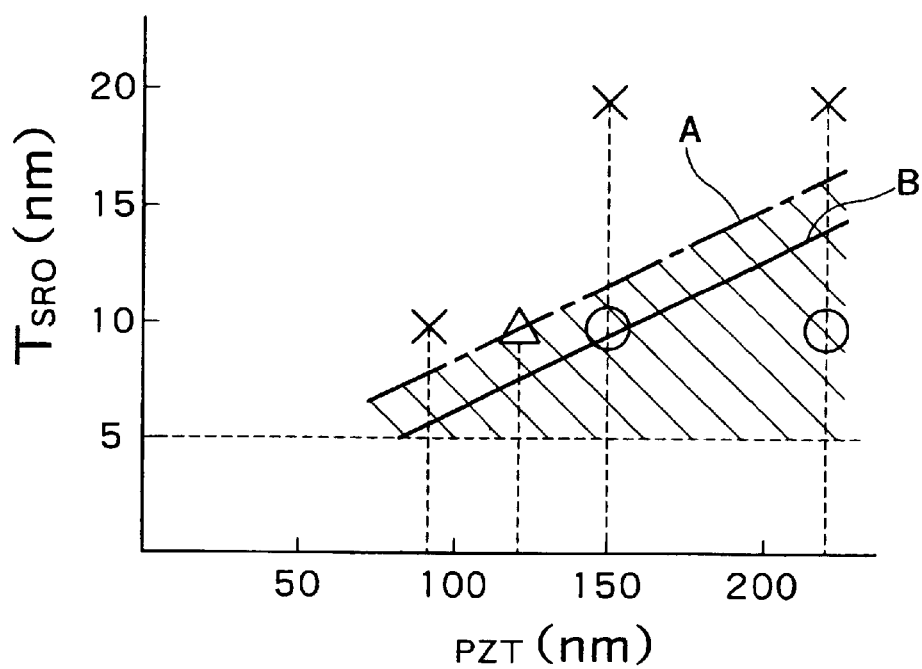
FIG. 45 is a diagram showing a relation between thickness and property of test samples according to the same embodiment.

From these results, based on data of major test samples, FIG. 45 shows whether their characteristics are good or poor in terms of the relation between the thickness $T_{pzt}$ of the PZT film and the thickness $T_{sro}$ of the SRO films. As apparent from the sample No. 7, when the thickness $T_{sro}$ of the SRO film is thinner than 5 nm, that is, the total thickness of the upper and lower SRO films is thinner than 10 nm, the result is not good. In the hatched area sectioned by the alternate long and short dash line A and the minimum possible value 5 nm of the thickness $T_{sro}$ of the SRO film under the current technology, acceptable results are obtained. This hatched region can be expressed approximately by $10 \leq T_{sro}(BE) + T_{sro}(TE) \leq (3/20)T_{pzt} - 2$. This range is roughly approximated $10 \leq T_{sro}(BE) + T_{sro}(TE) \leq (2/12)T_{pzt}$. The most preferable range is the area under the solid line B, and this is roughly expressed by $10 \leq T_{sro}(BE) + T_{sro}(TE) \leq (2/15)T_{pzt}$.

Regarding the crystallization temperature, in the sample No. 3 of 750° C., the leakage is large, and this shows that the crystallization annealing is excessive.

Figure 46:
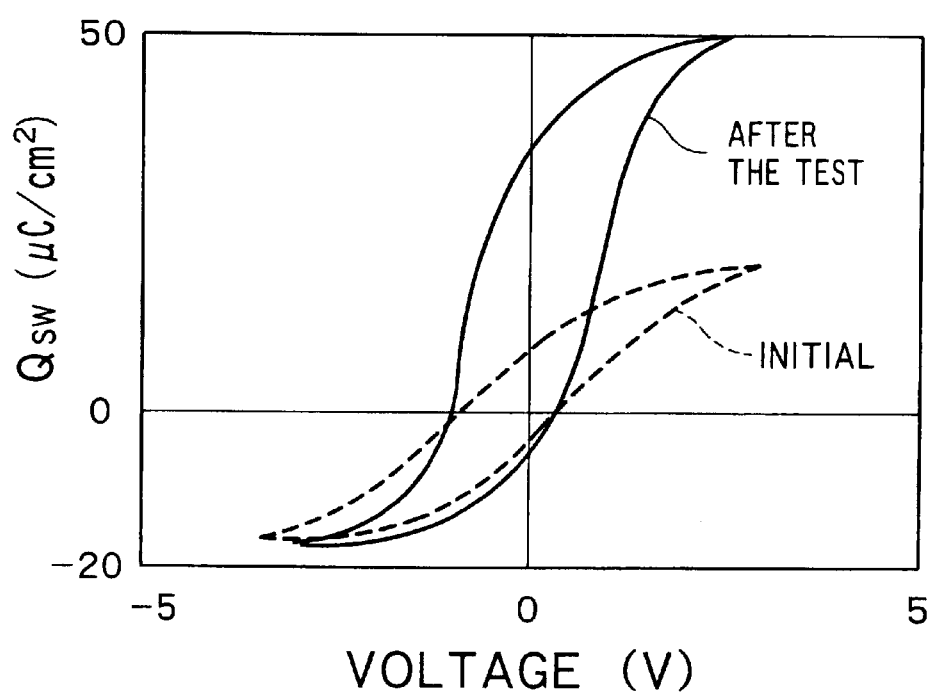
FIG. 46 is a diagram showing a relation between initial property and fatigue characteristic of good-quality test samples according to the same embodiment.
Figure 47:
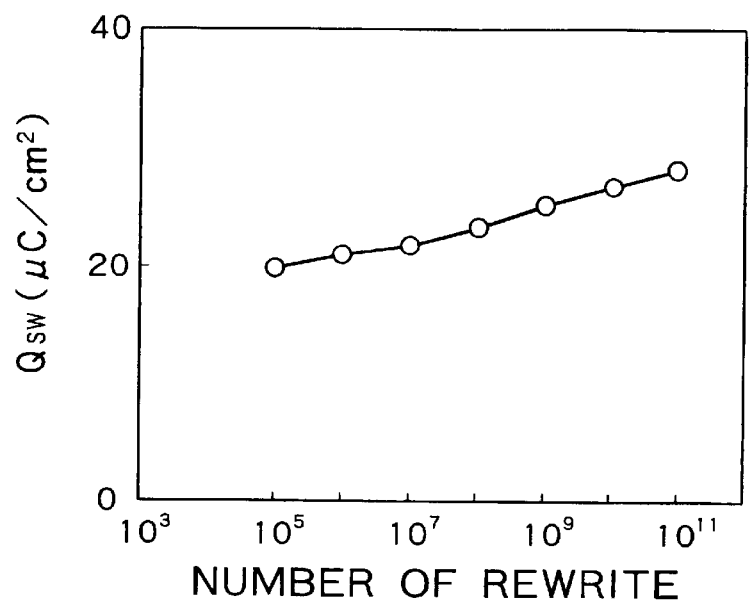
FIG. 47 is a diagram showing fatigue characteristics of good-quality test samples according to the same embodiment.

FIG. 46 shows the spontaneous polarization amount (solid line) of the test sample No. 4 after a fatigue test (a stress of a.c. 5V is applied with the pulse width of 20 $\mu$S is applied $3^{10}$ times) together with the initial state (broken line). FIG. 47 shows a relation between the number of fatigue tests and the spontaneous polarization amount. It is known from FIG. 46 that, as compared with the initial state of about 20 $\mu C/cm^2$, the value becomes 30 $\mu C/cm^2$ after fatigue, and the property is improved compared to the initial status.

That is, when the ferroelectric capacitor having a Pt/SRO/PZT/SRO/Pt structure as illustrated is made, by appropriately selecting thicknesses of the PZT film and the SRO films within the range satisfying the above-introduced equation, a ferroelectric capacitor improved in fatigue characteristic is obtained. That is, it is possible to obtain a ferroelectric capacitor whose property becomes better as rewriting is repeated.

(Twelfth Embodiment)

Ferroelectric random access memory having ferroelectric capacitors using a PZT film involves the problem about characteristic deterioration by process damage to the capacitors. Normally, regarding such process damage, damage recovery process is conducted by high-temperature annealing in an oxygen atmosphere after the capacitor are made and before the metal wiring is formed. After the metal wiring is formed, high-temperature annealing is not possible. However, researches made heretofore regarding the damage process are not sufficient, and in most cases, damage is not cured sufficiently. If the damage recovery is insufficient, resistivity to damage in later steps also decreases, and this invites deterioration of the electric property, reliability and production yield of the finished ferroelectric random access memory.

In the embodiment shown here, reliable damage recovery is possible because of the improvement of the contact structure of the ferroelectric capacitor.

Figure 48:
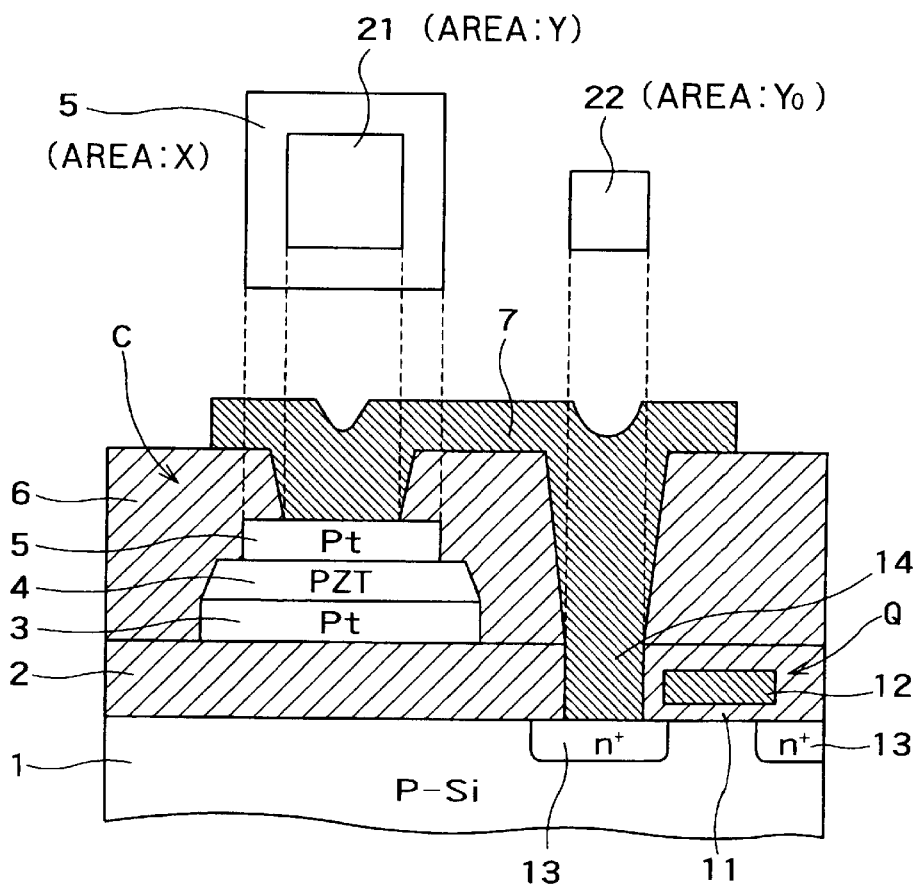
FIG. 48 is a diagram showing the structure of a ferroelectric capacitor of ferroelectric random access memory according to the twelfth embodiment of the invention.

FIG. 48 shows a ferroelectric random access memory structure according to the embodiment from this viewpoint. The silicon substrate 1 has formed a transistor Q forming a memory cell together with the ferroelectric capacitor C. The transistor Q includes a gate electrode 12 formed on the silicon substrate 1 via a gate insulating film 11, and an n-type diffusion layer 13 formed in self alignment with the gate electrode 12. The substrate having formed the transistor Q is covered and smoothed by the inter-layer insulating film 2. In the inter-layer insulating film 2, a contact plug 14 for the n-type diffusion layer 13 is buried.

Formed on the inter-layer insulating film 2 is the ferroelectric capacitor C made up of the lower Pt electrode 3, PZT film 4 and upper electrode 5. On the substrate having formed the ferroelectric capacitor C, the inter-layer insulating film 6 is further formed. Made on the inter-layer insulating film 6 is a first-layer metal wiring 7 is formed to connect the upper electrode of the capacitor C and the n-type diffusion layer 13 of the transistor Q.

A feature of this embodiment lies in the contact 21 of the metal wiring 7 to the ferroelectric capacitor C being configured so that its contact area Y relative to the area X of the upper electrode satisfies $Y/X \geq 0.5$. Usually, the size of the contact is determined constant according to a design rule, and the contact 22 of the metal wiring 7 to the n-type diffusion layer 13 and its contact to the ferroelectric capacitor C are equal. In contrast, in this embodiment, the contact 21 to the capacitor C is determined larger than the contact 22 to the diffusion layer 13. Then, this size of the contact 21 to the capacitor C is effective for damage recovery process prior to making the metal wiring.

Figure 49:
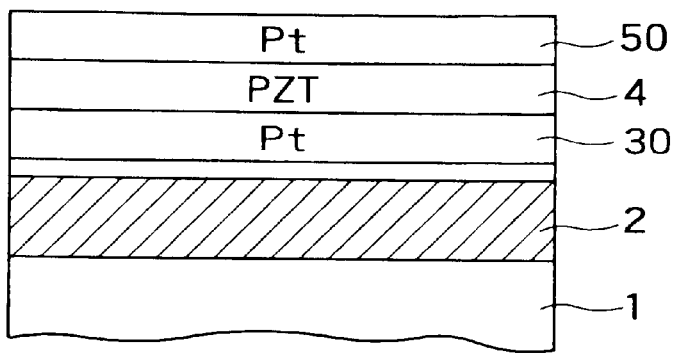
FIG. 49 is a diagram showing a manufacturing process of the ferroelectric capacitor according to the same embodiment.
Figure 50:
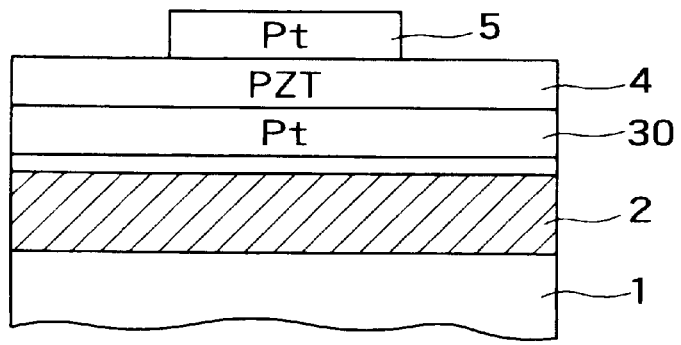
FIG. 50 is a diagram showing a manufacturing process of the ferroelectric capacitor according to the same embodiment.
Figure 51:
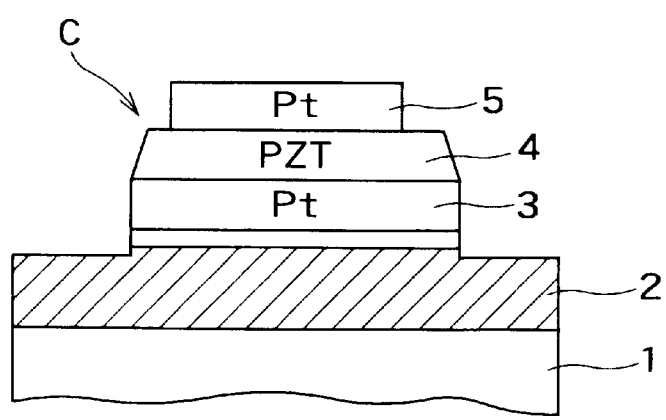
FIG. 51 is a diagram showing a manufacturing process of the ferroelectric capacitor according to the same embodiment.

FIGS. 49 through 51 show a manufacturing process, focusing at the capacitor C in the same embodiment. A Ti film is stacked as an adhesion layer to the thickness of about 20 nm on the inter-layer insulating film 2 by sputtering, and the lower Pt electrode film 30, about 150 nm thick, is stacked thereon by sputtering. Further stacked on the lower Pt electrode film 30 is the PZT film 4, about 200 nm thick, by sputtering or sol-gel technique. Thereafter, the PZT film 4 is processed by RTA (rapid thermal annealing) in an oxygen atmosphere for crystallization. On the PZT film 4, the upper electrode film 50 is stacked. The upper electrode 50 is a Pt film or a multi-layered film of SrRuO$_x$(1 nm)/Pt(175 nm).

Using a mask material, not shown, the upper electrode film 50 is etched, and by using a mask material covering the patterned upper electrode 5, the PZT film 4, lower Pt electrode film 30 and It film are processed by etching. In this status, annealing for damage recovery is conducted in an oxygen atmosphere of 650° C.

Further, the inter-layer insulating film 6 is stacked, and a contact hole 21 is made. At that time, as already explained, the contact 21 to the ferroelectric capacitor C is determined so that its contact area Y relative to the area X of the upper electrode satisfies Y/X≧0.5. In this status, annealing is again conducted in an oxygen atmosphere of 650° C. for damage recovery. Thereafter, wiring of a Ti/Al film is made.

Figure 52:
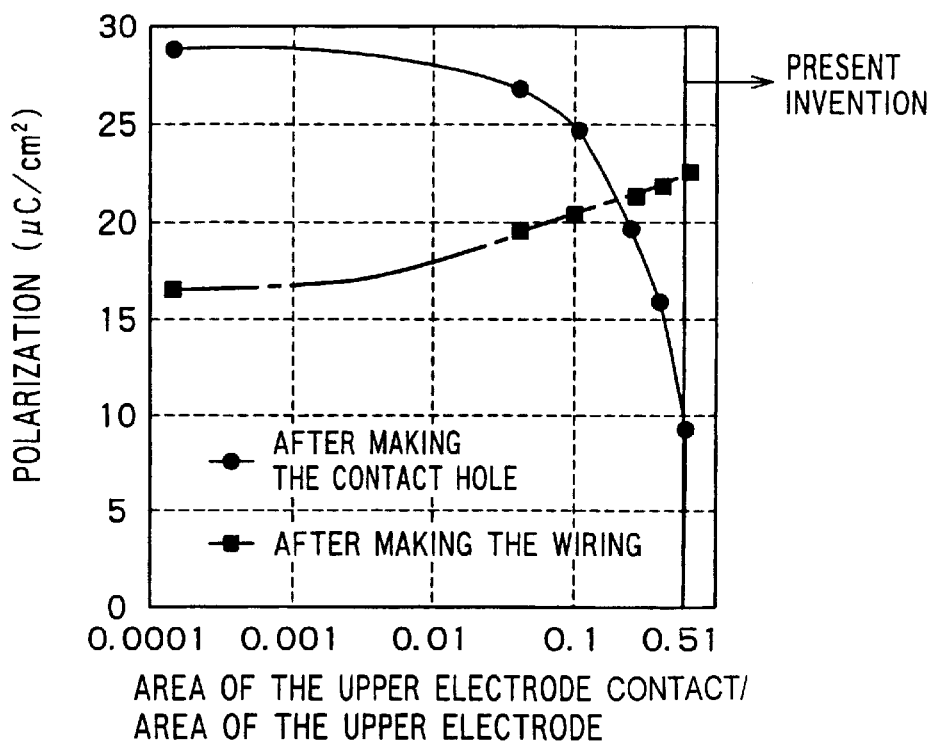
FIG. 52 is a diagram showing a relation between the ratio of contact area of the upper electrode and recovery characteristic of the ferroelectric capacitors in samples according to the same embodiment.
Figure 53:
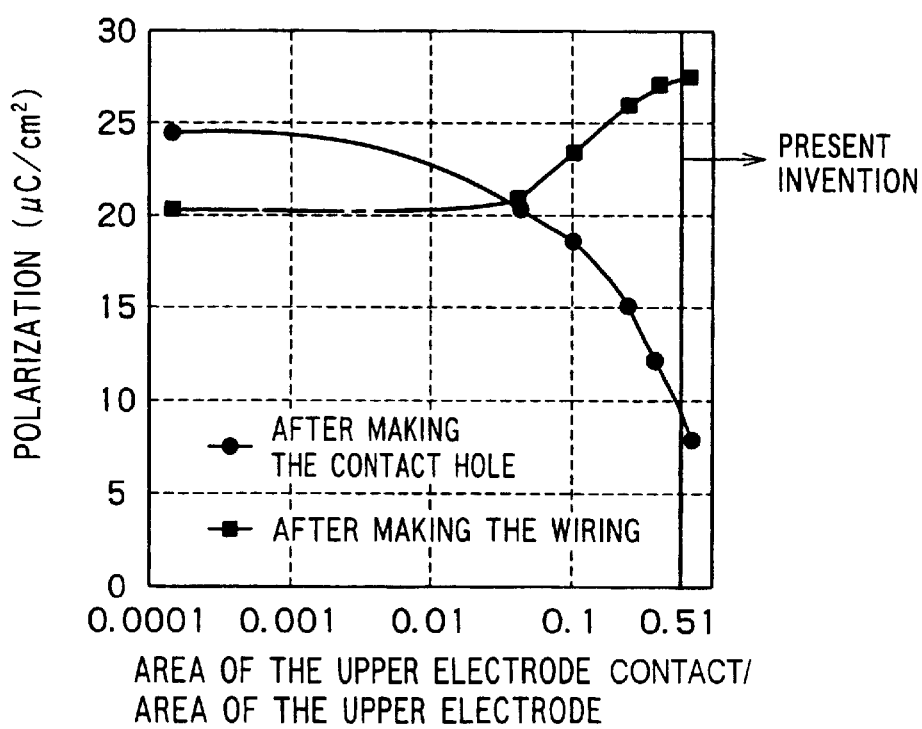
FIG. 53 is a diagram showing a relation between the ratio of contact area of the upper electrode and recovery characteristic of the ferroelectric capacitors in samples according to the same embodiment.

FIGS. 52 and 53 show measured results about relations between he size of the contact area to the upper electrode contact and the polarization amount for samples using a Pt film as the upper electrode and samples using a SRO/Pt film, respectively. In both drawings, the solid line shows polarization amounts under the condition where the upper electrode contact hole is made, and the alternate long and short line shows the polarization amount after recovery annealing under the same condition and making the wiring. In a conventional typical case, the ratio of the upper contact area is about 0.1, and in this case, in FIG. 52, the polarization amount after wiring is smaller than the polarization amount just after making the contact hole. When the ratio of the upper electrode contact area is 0.5 or more, the polarization amount after recovery annealing and wiring becomes remarkably larger than the polarization amount just after making the contact hole. FIG. 53 also shows a similar tendency.

(Thirteenth Embodiment)

Figure 54:
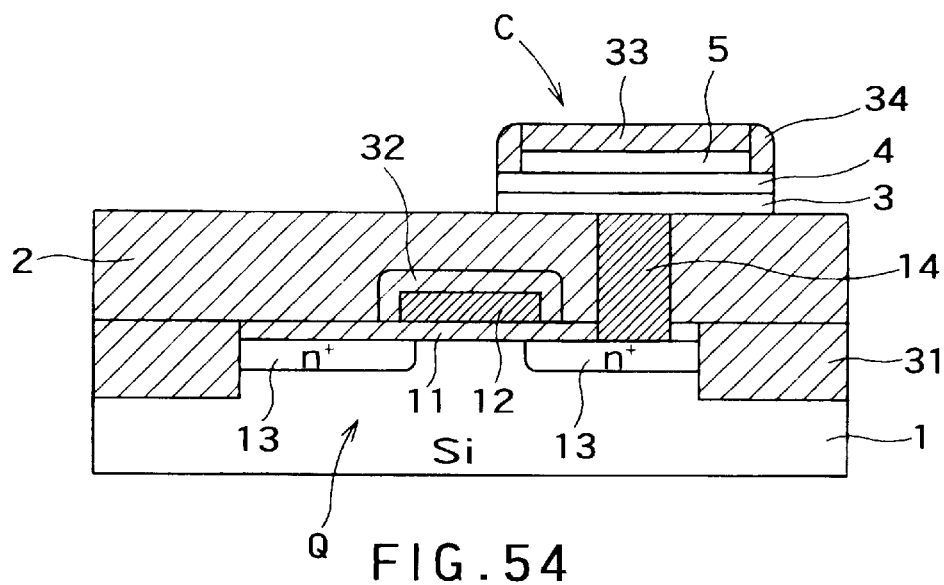
FIG. 54 is a diagram showing the structure of a ferroelectric capacitor of ferroelectric random access memory according to the thirteenth embodiment of the invention.

FIG. 54 shows an embodiment of ferroelectric random access memory having a COP structure, in which self-aligned minute ferroelectric capacitors are made in a single step of lithography. This manufacturing method is explained below in detail with reference to FIGS. 55 through 61.

Figure 55:
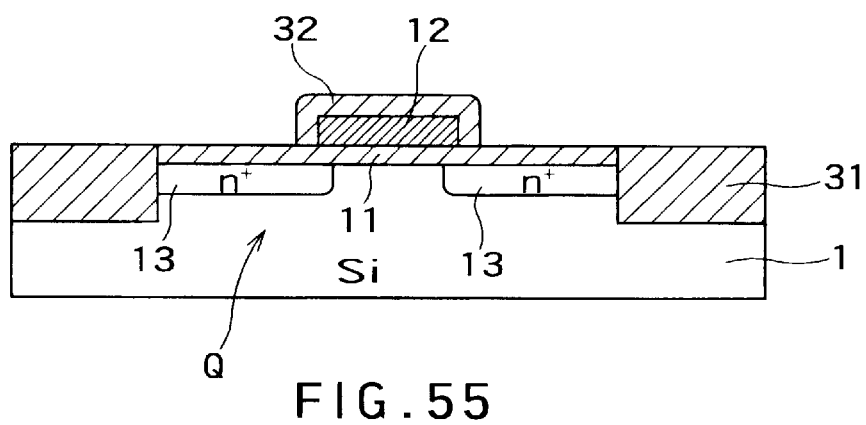
FIG. 55 is a diagram showing a manufacturing process of ferroelectric random access memory according to the twelfth embodiment.
Figure 56:
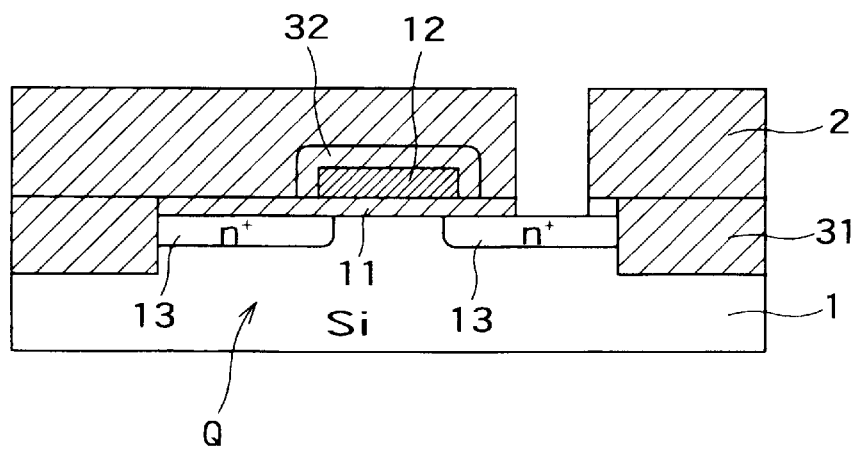
FIG. 56 is a diagram showing the manufacturing process of ferroelectric random access memory according to the same embodiment.

First made on the silicon substrate is an isolation insulating film 31 by STI (shallow trench isolation). Alternatively, the isolation insulating film 31 may be made by LOCOS. Then, after ion implantation into the silicon substrate for adjustment of the threshold value, a gate oxide film 11 is made, and a gate electrode 12 with a multi-layered structure including an n-type polycrystalline silicon film and a WSi or other silicide film is made. The gate electrode 12 is patterned as word lines by lithography. For making the gate electrode, self-alignment silicide (salicide) technique may be used. Around the gate electrode 12, a protective film 32 is formed by thermal oxidation. Alternatively, a stacked film may be used as the protective film 32. Thereafter, by ion implantation, an n-type diffusion layer 13 is formed in the source and drain regions (FIG. 55).

Figure 57:
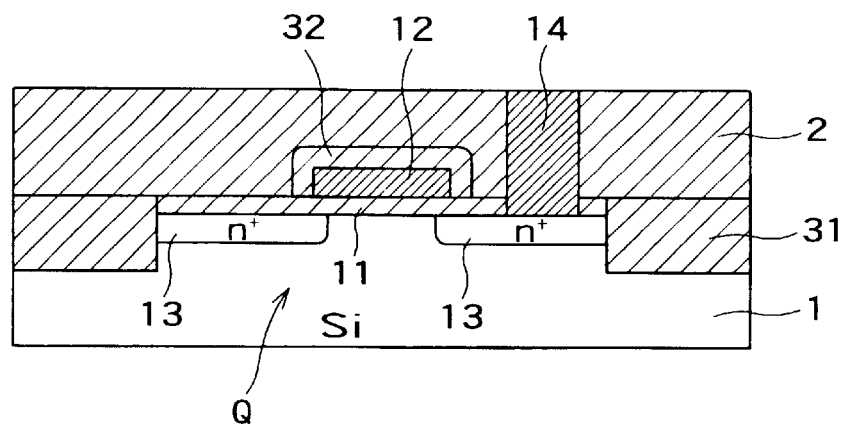
FIG. 57 is a diagram showing the manufacturing process of ferroelectric random access memory according to the same embodiment.

Subsequently, after a first inter-layer insulating film 2 is stacked and leveled, a contact hole for the n-type diffusion layer 13 made (FIG. 56), and a contact plug 16 is buried in the contact hole (FIG. 57). To bury the contact plug 14, a conductive material such as tungsten is stacked by sputtering or vapor deposition, and it is leveled by CMP. Alternatively, the contact plug 14 may be buried by selective growth of tungsten, for example.

After that, on the inter-layer insulating film 2 having the buried contact plug 14, materials for the capacitor, namely, the lower Pt electrode film 30, PZT film 4 and upper electrode film 50, are sequentially stacked. The PZT film 4, after being stacked, undergoes crystallization annealing at 650~700° C. Between the lower Pt electrode 30 and the upper Pt electrode 50, and the PZT film 4, SRO films are preferably interposed as explained in the eleventh embodiment.

Figure 58:
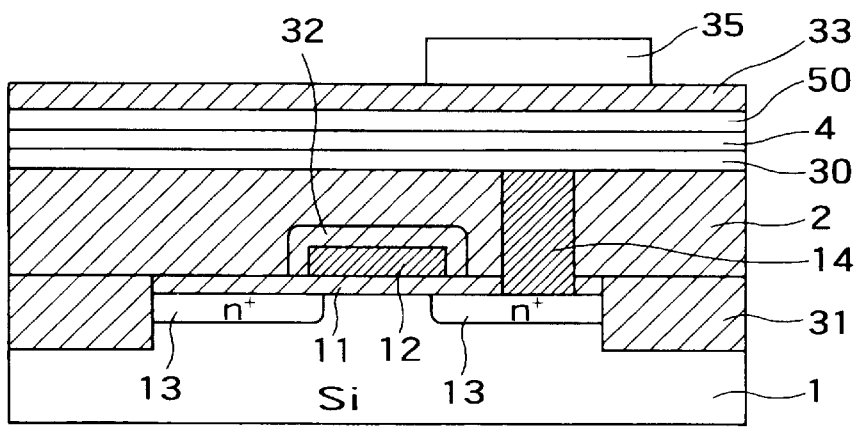
FIG. 58 is a diagram showing the manufacturing process of ferroelectric random access memory according to the same embodiment.
Figure 59:
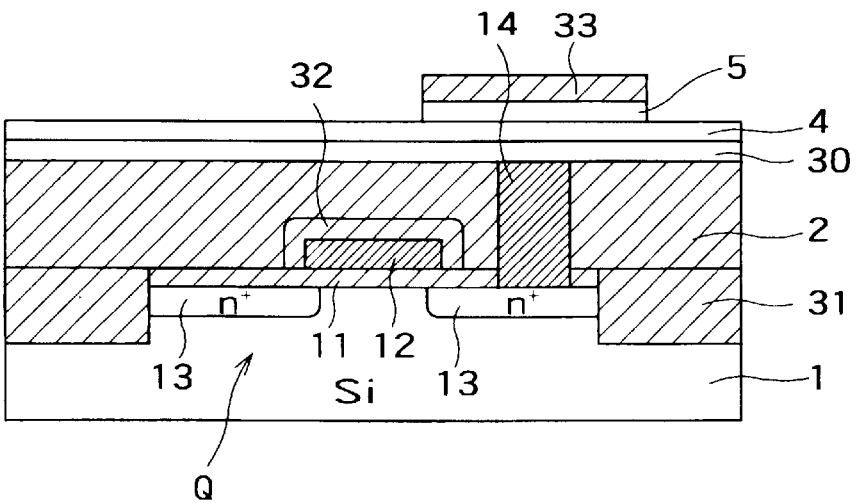
FIG. 59 is a diagram showing the manufacturing process of ferroelectric random access memory according to the same embodiment.

After these films are made, a hard mask material 33 of silicon oxide or silicon nitride, for example, is stacked, and a resist pattern 35 is formed and patterned thereon (FIG. 58). Then, a hard mask material 33 is patterned by anisotropic etching, and the resist pattern is removed by ashing. Thereafter, the upper electrode material film 50 is etched to pattern the upper electrode 5 (FIG. 59).

Figure 60:
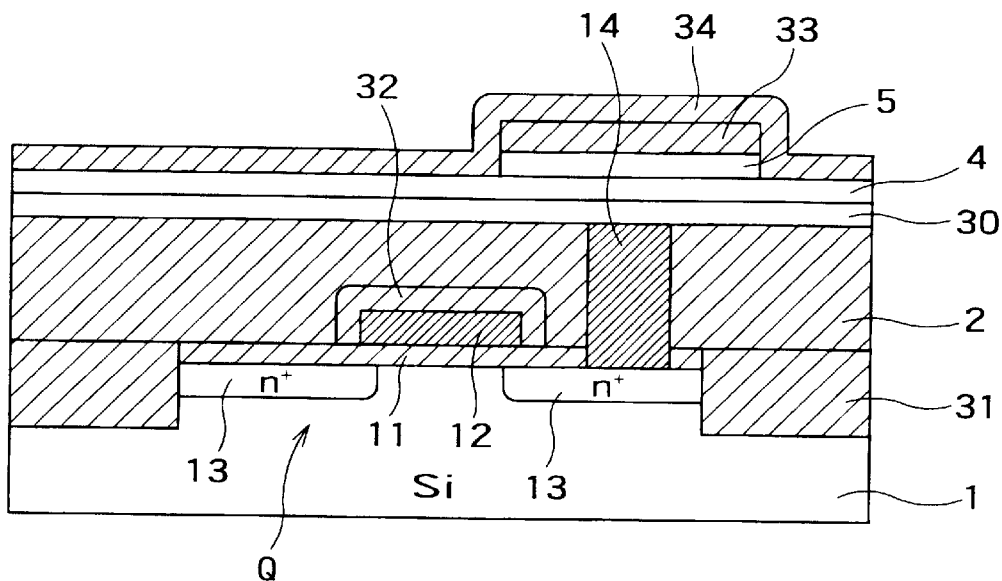
FIG. 60 is a diagram showing the manufacturing process of ferroelectric random access memory according to the same embodiment.

After that, a hard mask material 34 is again stacked (FIG. 60). The hard mask material 34 is preferably the same material as the hard mask material 33 used before, but a different material is also acceptable therefor. The hard mask material 34 has a thickness in the range from substantially the same as the thickness of the PZT film 4 to less than twice the same. Its reason is that, because the electric line of force passing from an end of the upper electrode 5 to the lower electrode extends to outside by about the thickness of the PZT film 4, an equivalent side wall thickness is required. Further, taking alleviation of process damage into consideration, it is preferable that the side walls are amply thick, but from the viewpoint of miniaturization, this degree of film thickness is the optimum thickness.

Figure 61:
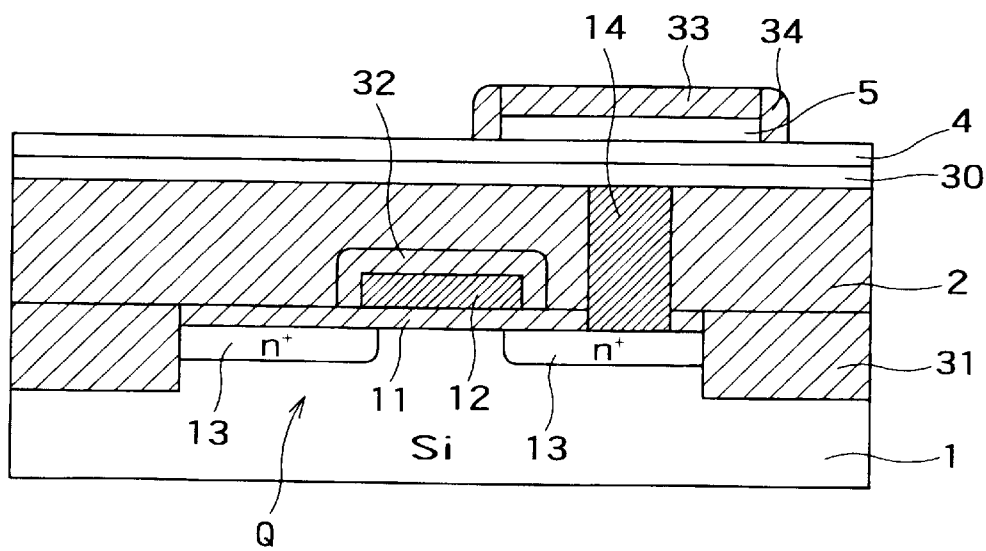
FIG. 61 is a diagram showing the manufacturing process of ferroelectric random access memory according to the same embodiment.

Then, by an etch-back process using anisotropic dry etching, the hard mask material 34 is maintained only on side surfaces of the first hard mask 33 and the upper electrode 5 (FIG. 61). Thereafter, using the hard masks 33, 34 as a mask, the PZT film 4 and the lower Pt electrode film 30 are patterned by anisotropic etching (FIG. 54). As a result, here is obtained the ferroelectric capacitor having a structure in which the PZT film 4 and the lower Pt electrode 3 have a wider area than the upper Pt electrode 5, that is, the ferroelectric capacitor having a fringe structure.

Also in this embodiment, a hydrogen barrier film as explained in the first embodiment is preferably made for reliability.

As explained above, according the embodiment, a ferroelectric capacitor including a ferroelectric film having a fringe over the upper electrode can be obtained in a single process of lithography. By the use of the fringe, the ferroelectric capacitor can be protected from damage in a later process. Additionally, since the lower electrode extends beyond the perimeter of the upper electrode, it is prevented that the stacked film (fence) stacked on the side surfaces of the PZT film during etching of the lower electrode contacts or touches the upper electrode. Furthermore, since the electric line of force between the upper electrode end and the lower electrode passes through the ferroelectric film, a function equivalent to that of the case with the upper electrode having a large area can be obtained.

In the embodiments explained above, excluding the embodiment of the COP structure, upper electrodes are independently provided for individual ferroelectric capacitor. Therefore, regarding the lower electrodes, it is necessary to connect each commonly to a plurality of memory cells. Although explanation about has been omitted, lower electrodes may be patterned continuously in form of a plate in the direction normal to a cross-sectional plane of the element of each figure, for example. In case of FIG. 54, a plate connecting upper electrodes is to be provided.

In the embodiments heretofore explained, the PZT film is used as the ferroelectric film. However, also when using a layer-structured oxide ferroelectric material having a perovskite crystalline structure, such as PLZT ((Pb, La)(Zr, Ti)O$_3$ or SBT (SrBi$_2$Ta$_2$O$_9$), the invention is applicable in the same manner.

Further, the eleventh embodiment 11 is effective also when using an electrode of another metal such as Ir, for example, instead of the Pt electrode, and the other embodiments are effective also when using an Ir electrode, an electrode of a metal oxide such as $Ir_xO_y$, $Ru_xO_y$, $SrRuO_x$, etc., or a complex electrode of these metal oxides.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising:
    a semiconductor substrate;
    an insulating film formed on said semiconductor substrate;
    a ferroelectric capacitor having a lower electrode, a ferroelectric film and an upper electrode which are stacked on said insulating film;
    a first hydrogen barrier film;
    a first inter-layer insulating film covering side surfaces and top surfaces of said ferroelectric capacitor;
    a second inter-layer insulating film stacked on said first inter-layer insulating film,
    said first hydrogen barrier film being interposed between and in contact with said first and second interlayer insulating films in a region substantially surrounding said ferroelectric capacitor; and
    a wiring layer provided above the second inter-layer insulating film.

2. The semiconductor device according to claim 1 wherein said first inter-layer insulating film has a thickness limited in the range of not smaller than 0.05 times to not larger than three, times of thickness of said ferroelectric capacitor.

3. The semiconductor device according to claim 1 wherein said first inter-layer insulating film contains a silicon oxide or a silicon nitride as a major component thereof.

4. The semiconductor device according to claim 1 wherein said first insulating film is formed at a temperature from 300 to 400° C.

5. The semiconductor device according to claim 1 wherein said first and second inter-layer insulating films are made of a material different from that of said first hydrogen barrier film.

6. The semiconductor device according to claim 1 wherein said first hydrogen barrier film is made of a metal oxide which has a hydrogen diffusion constant not higher than $10^{-5}$ cm$^2$/s in its interior portion.

7. The semiconductor device according to claim 1 wherein said first hydrogen barrier film is made of a metal oxide whose specific resistance is not smaller than 1 kΩcm.

8. The semiconductor device according to claim 1 wherein said hydrogen barrier film contains at least one selected from the group consisting of $Al_2O_3$, $Al_xO_y$, $Al_xSi_yO_z$, $Ti_xO_y$, $Zr_xO_y$, $Mg_xO_y$ and $Mg_xTi_yO_z$ as a major component thereof.

9. A semiconductor device comprising:
    a semiconductor substrate;
    an insulating film formed on said semiconductor substrate;
    a ferroelectric capacitor having a lower electrode, a ferroelectric film and an upper electrode; and
    a first hydrogen barrier film,
    wherein said ferroelectric capacitor is buried in a groove formed in said insulating film, and said first hydrogen barrier film is provided inside said groove to cover at least the bottom surface and side surfaces of said ferroelectric capacitor.

10. The semiconductor device according to claim 9 further comprising a second hydrogen barrier film provided on said ferroelectric capacitor and not containing titanium.

11. The semiconductor device according to claim 9 wherein said first hydrogen barrier film is made of a metal oxide whose specific resistance is not smaller than 1 kΩcm.

12. The semiconductor device according to claim 9 wherein said first hydrogen barrier film contains at least one selected from the group consisting of $Al_2O_3$, $Al_xO_y$, $Al_xSi_yO_z$, $Zr_xO_y$ and $Mg_xO_y$ as a major component thereof.

13. The semiconductor device according to claim 10 wherein said second hydrogen barrier film contains at least one selected from the group consisting of $Al_2O_3$, $Al_xO_y$, $Al_xSi_yO_z$, $Zr_xO_y$ and $Mg_xO_y$ as a major component thereof.

14. The semiconductor device according to claim 9 further comprising an inter-layer insulating film interposed between said first hydrogen barrier film and said capacitor.

15. The semiconductor device according to claim 14 wherein said inter-layer insulating film contains a silicon oxide or a silicon nitride as a major component thereof.

16. The semiconductor device according to claim 14 wherein said first hydrogen barrier film contains at least one selected from the group consisting of $Al_2O_3$, $Al_xO_y$, $Al_xSi_yO_z$, $Ti_xO_y$, $Zr_xO_y$, $Mg_xO_y$ and $Mg_xTi_yO_z$ as a major component thereof.

17. A semiconductor device comprising:
    a semiconductor substrate;
    an insulating film formed on said semiconductor substrate;
    a ferroelectric capacitor having a lower electrode, a ferroelectric film and an upper electrode which are stacked sequentially on said insulating film; and
    a first hydrogen barrier film not containing titanium, said first hydrogen barrier film being interposed between said lower electrode and said insulating film.

18. The semiconductor device according to claim 17 wherein said first hydrogen barrier film is made of a metal oxide which has a hydrogen diffusion constant not higher than $10^{-5}$ cm$^2$/s in its interior portion.

19. The semiconductor device according to claim 17 wherein a re-deposit film containing the material of the hydrogen barrier film is formed on side surfaces of said ferroelectric film and said lower electrode.

20. The semiconductor device according to claim 17 wherein said hydrogen barrier film contains at least one selected from the group consisting of $Al_2O_3$, $Al_xO_y$, $Al_xSi_yO_z$, AlN, WN, $SrRuO_3$, $Ir_xO_y$, $Zr_xO_y$, $Ru_xO_y$, $Sr_xO_y$, $Re_xO_y$, $Os_xO_y$, and $Mg_xO_y$ as a major component thereof.

21. The semiconductor device according to claim 17 wherein said first hydrogen barrier film is provided on said upper electrode.

22. The semiconductor device according to claim 21 wherein said hydrogen barrier film contains at least one selected from the group consisting of $Al_2O_3$, $Al_xO_y$, $Al_xSi_yO_z$, AlN, WN, $SrRuO_3$, $Ir_xO_y$, $Zr_xO_y$, $Ru_xO_y$, $Sr_xO_y$, $Re_xO_y$, $Os_xO_y$, and $Mg_xO_y$ as a major component thereof.

23. A semiconductor device comprising:
    a semiconductor substrate;
    an insulating film formed on said semiconductor substrate;

a ferroelectric capacitor having a lower electrode, a ferroelectric film and an upper electrode which are stacked sequentially on said insulating film; and a first hydrogen barrier film not containing titanium, said ferroelectric film and said lower electrode having a larger area than said upper electrode, and said first hydrogen barrier film extending at least from the upper surface of said upper electrode along side surfaces thereof onto the surface of said ferroelectric film extending beyond perimeters of said upper electrode.

24. The semiconductor device according to claim 23 wherein said first hydrogen barrier film is made of a metal oxide whose specific resistance is not smaller than 1 kΩcm.

25. The semiconductor device according to claim 23 wherein said hydrogen barrier film contains at least one selected from the group consisting of $Al_2O_3$, $Al_xO_y$, $Al_xSi_yO_z$, $Zr_xO_y$ and $Mg_xO_y$ as a major component thereof.

26. A semiconductor device comprising:

a semiconductor substrate;

an insulating film formed on said semiconductor substrate;

a ferroelectric capacitor having a lower electrode, a ferroelectric film and an upper electrode which are stacked sequentially on said insulating film; and a first hydrogen barrier film not containing titanium, said lower electrode having a larger area than said upper electrode and said ferroelectric film, and said first hydrogen barrier film extends from the upper surface of said upper electrode along side surfaces thereof and side surfaces of said ferroelectric film onto the surface of said lower electrode extending beyond perimeters of said ferroelectric film.

27. The semiconductor device according to claim 26 wherein said first hydrogen barrier film is made of a metal oxide whose specific resistance is not smaller than 1 kΩcm.

28. The semiconductor device according to claim 26 wherein said hydrogen barrier film contains at least one selected from the group consisting of $Al_xO_y$, $Al_xSi_yO_z$, $Zr_xO_y$ and $Mg_xO_y$ as a major component thereof.

29. The semiconductor device according to claim 17 further comprising: a first $Sr_xRu_yO_z$ film provided between said ferroelectric film and said lower electrode; and a second $Sr_xRu_yO_z$ film provided between said ferroelectric film and said upper electrode, said first and second $Sr_xRu_yO_z$ films having thickness $T_{sro}(BE)$ (nm) and $T_{sro}(TE)$ (nm) which are limited in the range of $10 \leq T_{sro}(BE)+T_{sro}(TE) \leq (2/12)T_{pzt}$ with respect to the thickness $T_{pzt}$ (nm) of said ferroelectric film.

30. The semiconductor device according to claim 17 further comprising:

a titanium compound film formed on said upper electrode;

an inter-layer insulating film provided on said titanium compound film; and a wiring connected to said upper electrode through a contact hole formed through said inter-layer insulating film.

31. The semiconductor device according to claim 30 wherein said wiring is an aluminum reflow wiring.

* * * * *

UNITED STATES PATENT AND TRADEMARK OFFICE
CERTIFICATE OF CORRECTION

PATENT NO.    : 6,611,014 B1
DATED         : August 26, 2003
INVENTOR(S)   : Hiroyuki Kanaya et al.

It is certified that error appears in the above-identified patent and that said Letters Patent is hereby corrected as shown below:

Title page,
Item [75], Inventors, "Yokohama" has been replaced with -- Kanagawa --; "Sagamihara" has been replaced with -- Kanagawa --; "Hachioji" has been replaced with -- Tokyo --; "Yokohama" has been replaced with -- Kanagawa --; "Yokohama" has been replaced with -- Kanagawa --; "Urayasu" has been replaced with -- Chiba --; and Column 28,
Line 17, "$10 \leq T_{sro}(BE)+T_{sro}(TE) \leq (2/12)T_{pzt}$" has been replaced with -- $10 \leq T_{sro}(BE)+T_{sro}(TE) \leq (2/12)T_{pzt}$ --.

Signed and Sealed this

Twentieth Day of January, 2004

JON W. DUDAS
*Acting Director of the United States Patent and Trademark Office*